(12) United States Patent
Liu et al.

(10) Patent No.: US 12,255,255 B2
(45) Date of Patent: Mar. 18, 2025

(54) METHOD OF MANUFACTURING A FinFET WITH MERGED EPITAXIAL SOURCE/DRAIN REGIONS

(71) Applicant: Taiwan Semiconductor Manufacturing Co., Ltd., Hsinchu (TW)

(72) Inventors: Wei-Min Liu, Hsinchu (TW); Li-Li Su, ChuBei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 248 days.

(21) Appl. No.: 17/815,020

(22) Filed: Jul. 26, 2022

(65) Prior Publication Data

US 2022/0359742 A1 Nov. 10, 2022

Related U.S. Application Data

(62) Division of application No. 16/991,149, filed on Aug. 12, 2020, now Pat. No. 11,527,650.
(Continued)

(51) Int. Cl.
*H01L 29/66* (2006.01)
*H01L 21/02* (2006.01)
(Continued)

(52) U.S. Cl.
CPC ...... *H01L 29/785* (2013.01); *H01L 21/02433* (2013.01); *H01L 21/0262* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 9,831,116 B2 11/2017 Lee et al.
9,953,875 B1 4/2018 Cheng et al.
(Continued)

FOREIGN PATENT DOCUMENTS

CN 106206727 A 12/2016
CN 107424934 A 12/2017
(Continued)

*Primary Examiner* — Younes Boulghassoul
(74) *Attorney, Agent, or Firm* — Slater Matsil, LLP

(57) ABSTRACT

A device includes a first fin and a second fin extending from a substrate, the first fin including a first recess and the second fin including a second recess, an isolation region surrounding the first fin and surrounding the second fin, a gate stack over the first fin and the second fin, and a source/drain region in the first recess and in the second recess, the source/drain region adjacent the gate stack, wherein the source/drain region includes a bottom surface extending from the first fin to the second fin, wherein a first portion of the bottom surface that is below a first height above the isolation region has a first slope, and wherein a second portion of the bottom surface that is above the first height has a second slope that is greater than the first slope.

20 Claims, 24 Drawing Sheets

Related U.S. Application Data

(60) Provisional application No. 62/928,197, filed on Oct. 30, 2019.

(51) Int. Cl.
  | | |
  |---|---|
  | *H01L 21/3065* | (2006.01) |
  | *H01L 21/8238* | (2006.01) |
  | *H01L 29/04* | (2006.01) |
  | *H01L 29/08* | (2006.01) |
  | *H01L 29/10* | (2006.01) |
  | *H01L 29/78* | (2006.01) |
  | *H01L 27/092* | (2006.01) |

(52) U.S. Cl.
  CPC .... *H01L 21/823814* (2013.01); *H01L 29/045* (2013.01); *H01L 29/0847* (2013.01); *H01L 29/1037* (2013.01); *H01L 29/66545* (2013.01); *H01L 29/66795* (2013.01); *H01L 29/7848* (2013.01); *H01L 21/3065* (2013.01); *H01L 27/0924* (2013.01)

(58) Field of Classification Search
  CPC ........... H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823418; H01L 21/823814; H01L 21/823425; H01L 29/0847; H01L 29/7848; H01L 29/66636; H01L 29/66575; H01L 21/02609; H01L 29/04; H01L 29/045; H01L 29/0653; H01L 29/4991; H01L 21/764; H01L 21/7682; H01L 21/3065; H01L 21/461; H10B 12/36; H10B 12/056
  See application file for complete search history.

(56) References Cited

U.S. PATENT DOCUMENTS

| | | | |
|---|---|---|---|
| 10,141,431 B1 * | 11/2018 | Hung | ................. H01L 21/3065 |
| 10,217,815 B1 | 2/2019 | Chu et al. | |
| 10,269,648 B1 | 4/2019 | Li et al. | |
| 2014/0264489 A1 | 9/2014 | Wong et al. | |
| 2015/0021696 A1 | 1/2015 | Sung et al. | |
| 2015/0333061 A1 | 11/2015 | Kim et al. | |
| 2016/0111420 A1 | 4/2016 | Zhang et al. | |
| 2016/0111540 A1 | 4/2016 | Zhang et al. | |
| 2016/0315081 A1 | 10/2016 | Park et al. | |
| 2017/0053912 A1 | 2/2017 | Ching et al. | |
| 2017/0133286 A1 | 5/2017 | Sung et al. | |
| 2017/0317078 A1 | 11/2017 | Chang et al. | |
| 2017/0323795 A1 | 11/2017 | Li et al. | |
| 2018/0151563 A1 * | 5/2018 | Chang | ............... H01L 29/41791 |
| 2018/0151698 A1 | 5/2018 | Sung et al. | |
| 2018/0151703 A1 * | 5/2018 | Lin | ....... H01L 29/161 |
| 2018/0174912 A1 | 6/2018 | Lee et al. | |
| 2018/0175046 A1 * | 6/2018 | Chiou | ................. H01L 29/7848 |
| 2018/0175172 A1 | 6/2018 | Chang et al. | |
| 2018/0190810 A1 | 7/2018 | Li et al. | |
| 2018/0286759 A1 | 10/2018 | Huang | |
| 2018/0358358 A1 | 12/2018 | Yu et al. | |
| 2018/0366373 A1 * | 12/2018 | Li | ..................... H01L 21/02532 |
| 2019/0006469 A1 * | 1/2019 | Kim | ..................... H01L 29/045 |
| 2019/0109217 A1 | 4/2019 | Lin et al. | |
| 2019/0287859 A1 | 9/2019 | Huang | |
| 2021/0043730 A1 | 2/2021 | Lee et al. | |
| 2022/0359730 A1 | 11/2022 | Chang et al. | |

FOREIGN PATENT DOCUMENTS

| | | |
|---|---|---|
| CN | 108122775 A | 6/2018 |
| CN | 108269850 A | 7/2018 |
| DE | 102017126881 A1 | 6/2018 |
| KR | 20150009936 A | 1/2015 |
| KR | 20150130087 A | 11/2015 |
| KR | 20160045526 A | 4/2016 |
| KR | 20170032823 A | 3/2017 |
| KR | 20180069674 A | 6/2018 |
| KR | 20190002247 A | 1/2019 |
| KR | 20190099385 A | 8/2019 |

* cited by examiner

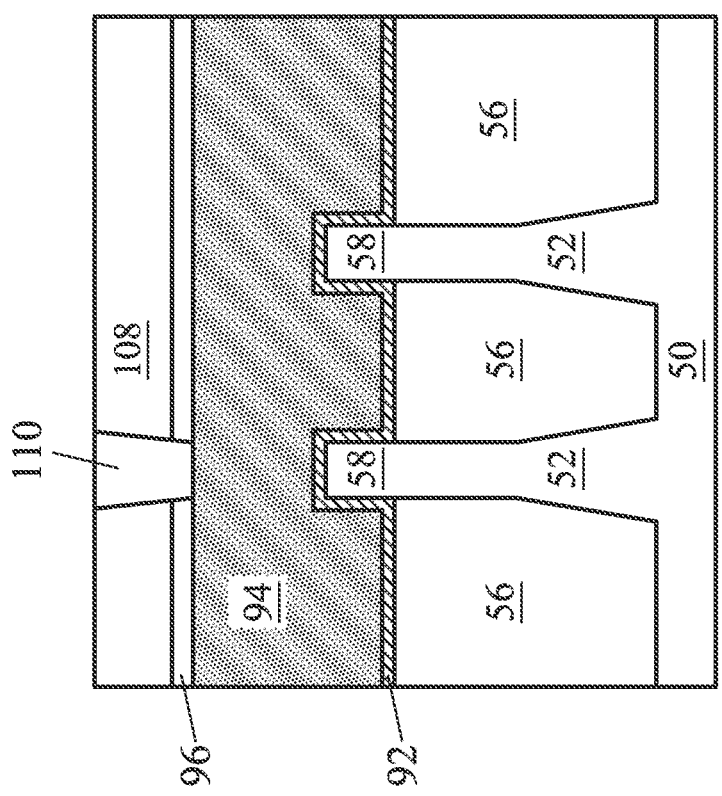
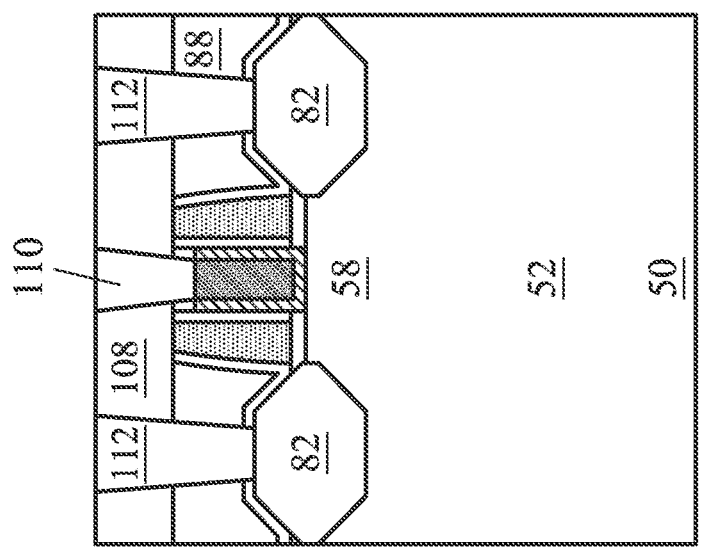
Figure 22A
Figure 22B

METHOD OF MANUFACTURING A FinFET WITH MERGED EPITAXIAL SOURCE/DRAIN REGIONS

PRIORITY CLAIM AND CROSS-REFERENCE

This application is a divisional of U.S. patent application Ser. No. 16/991,149, entitled "Semiconductor Device and Method," and filed Aug. 12, 2020, which claims the benefits of U.S. Provisional Application No. 62/928,197, filed on Oct. 30, 2019, which applications are hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17A, 17B, 18A, 18B, 19A, 19B, 20A, 20B, 20C, 21A, 21B, 22A, and 22B are cross-sectional views of intermediate stages in the manufacturing of a FinFET device, in accordance with some embodiments.

DETAILED DESCRIPTION

Figure 1:
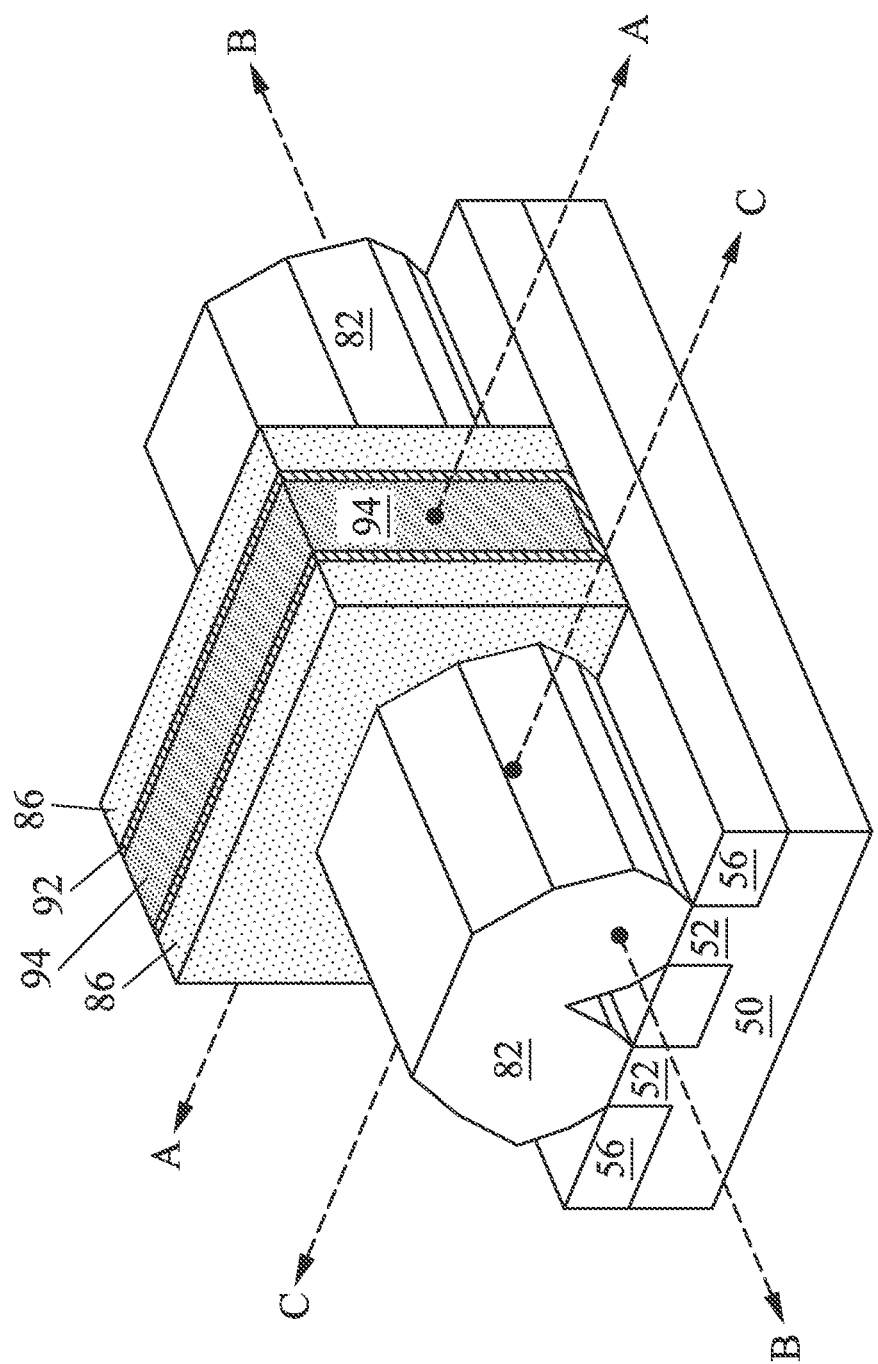
FIG. 1 illustrates an example of a FinFET device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming source/drain regions having reduced volume and reduced cross-sectional area. The source/drain regions may be formed by epitaxially growing a first epitaxial layer in a recess formed in a semiconductor fin, performing an etch back process, and then epitaxially growing a second epitaxial layer over the first epitaxial layer. Using the techniques described herein, adjacent source/drain regions may be formed that merge at a higher distance above the substrate, which reduces the cross-sectional area of the merged source/drain region. Semiconductor devices manufactured according to embodiments of the present application and including the source/drain regions may experience reduced gate-to-drain capacitance (Cgd), reduced RC delay, faster on/off switching, and boosted device speed.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 13B and 16 through 22B are cross-sectional views of intermediate stages in the manufacturing of FinFETs, in accordance with some embodiments. FIGS. 2, 3, 4, 5, 6, 7, 8A, 9A, 10A, 17A, 18A, 19A, 20A, 21A, and 22A are illustrated along reference cross-section A-A illustrated in FIG. 1, and FIGS. 8B, 9B, 10B, 17B, 18B, 19B, 20B, 20C, 21B, and 22B are illustrated along a similar cross-section B-B illustrated in FIG. 1. FIGS. 10C, 11, 12, 13A, 13B, and 16 are illustrated along reference cross-section C-C illustrated in FIG. 1.

Figure 2:
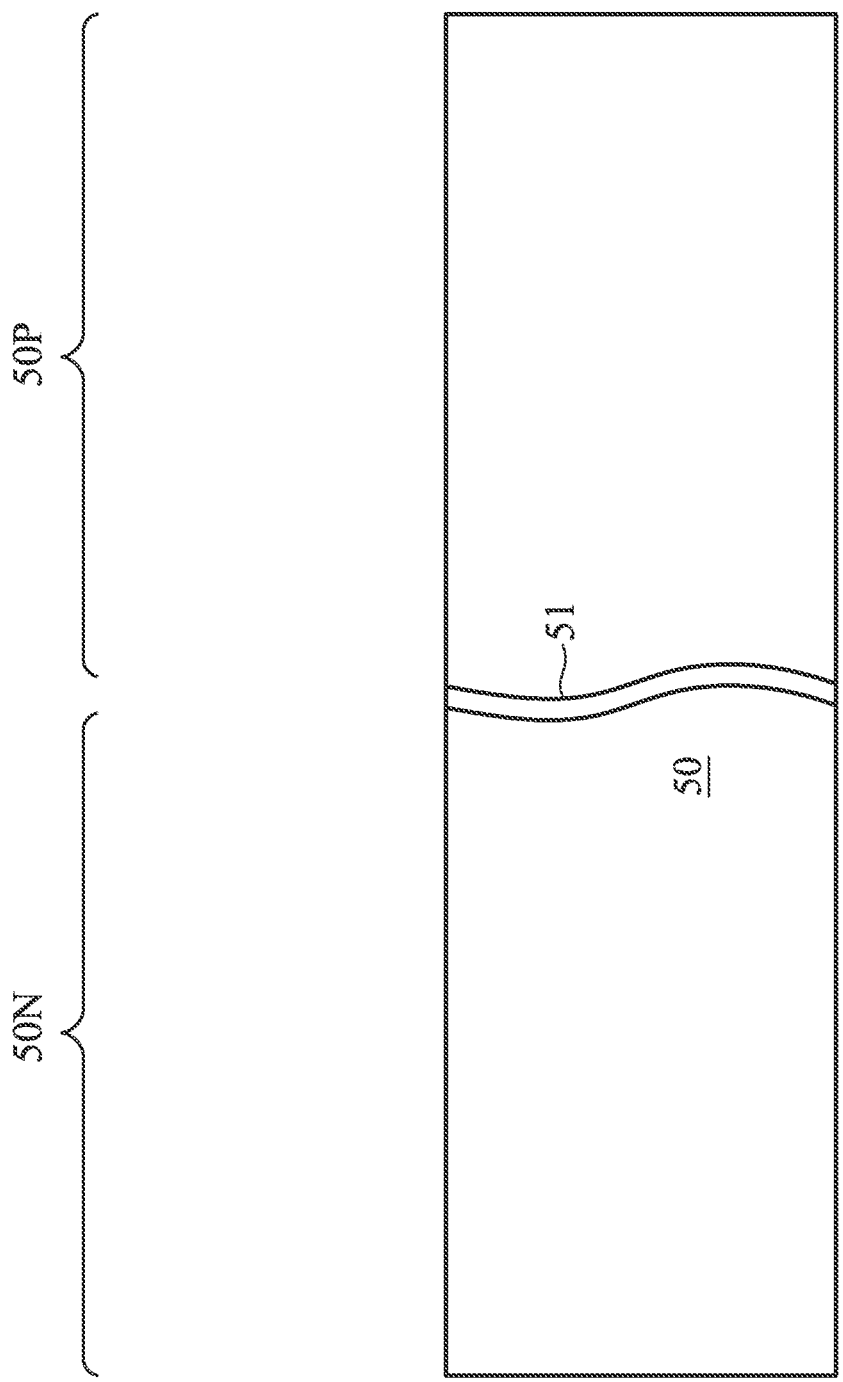
FIGS. 2, 3, 4, 5, 6, 7, 8A, 8B, 9A, 9B, 10A, 10B, and 10C are cross-sectional views of intermediate stages in the manufacturing of a FinFET device, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
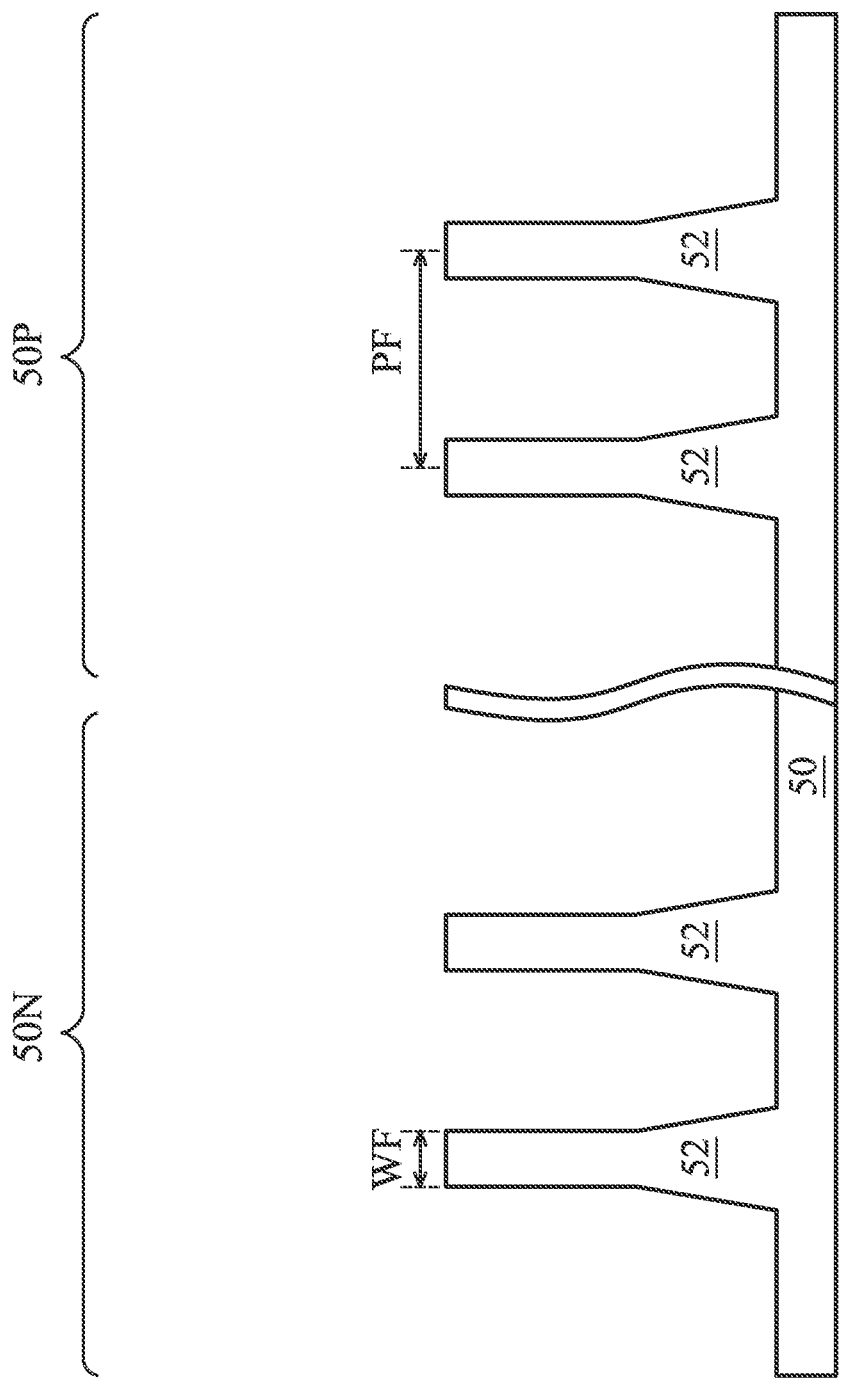

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. In some embodiments, the fins 52 may be formed having a width WF that is between about 5 nm and about 30 nm. In some embodiments, the fins 52 may be formed having a pitch PF that is between about 10 nm and about 40 nm.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
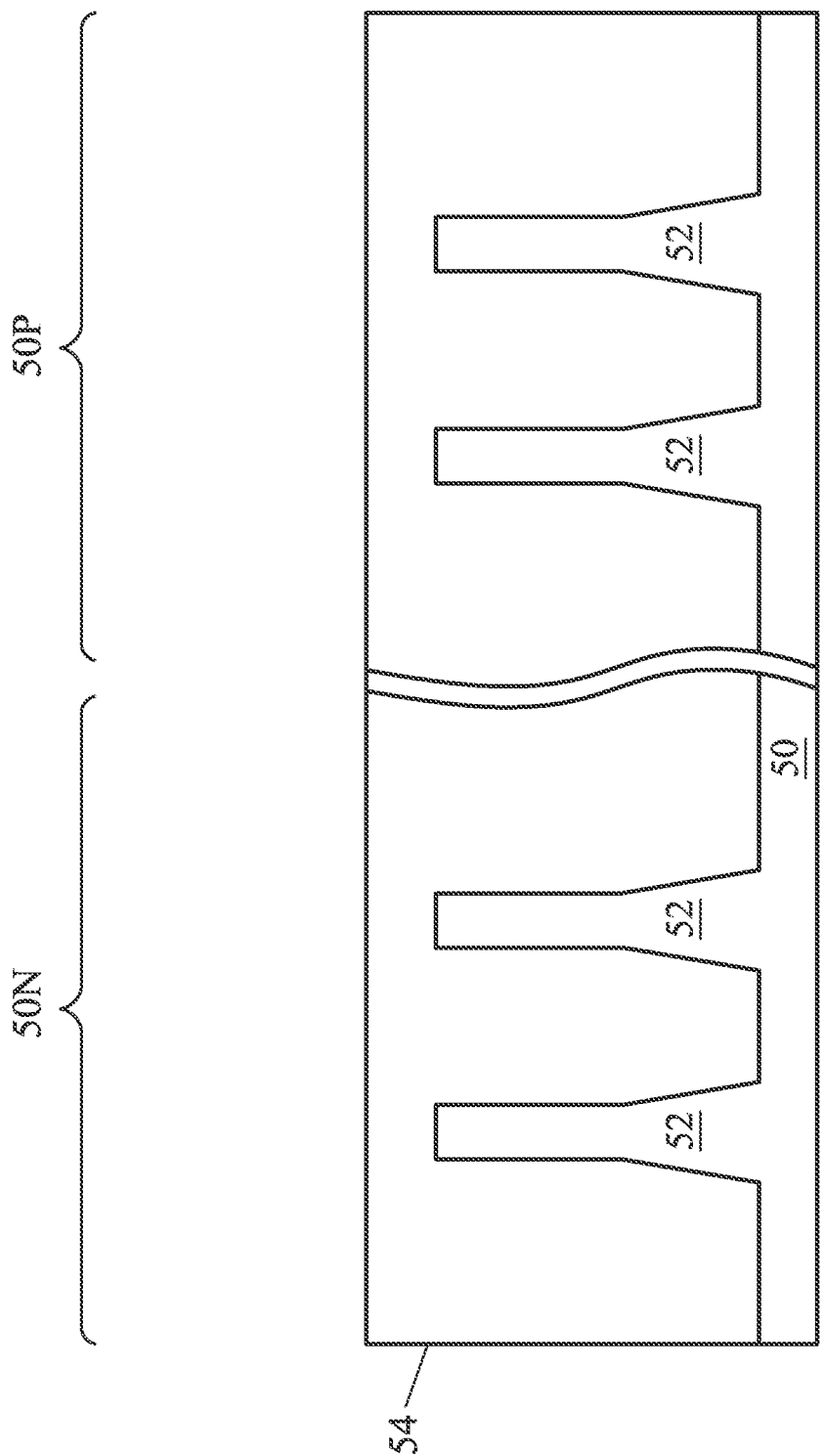

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
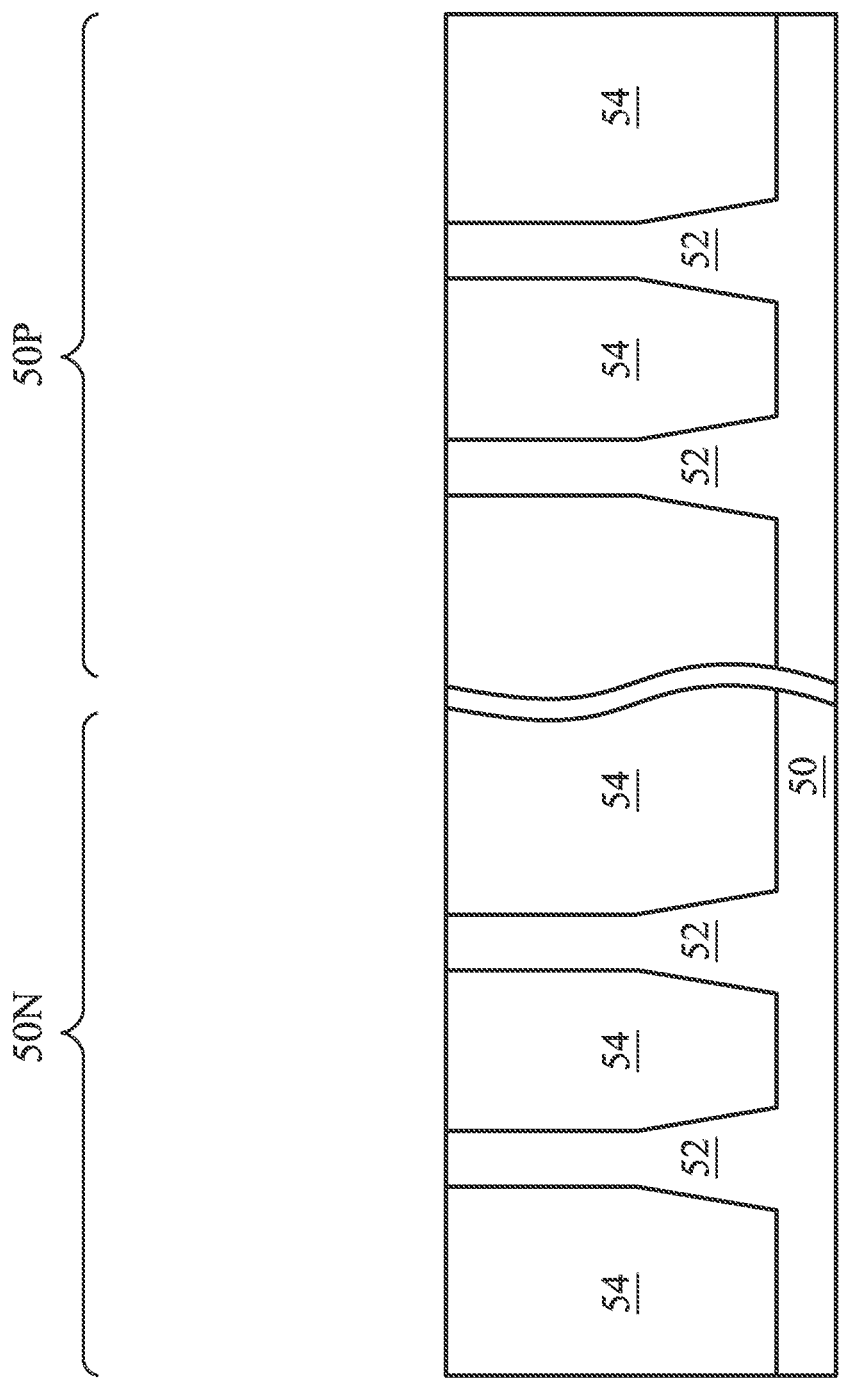

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
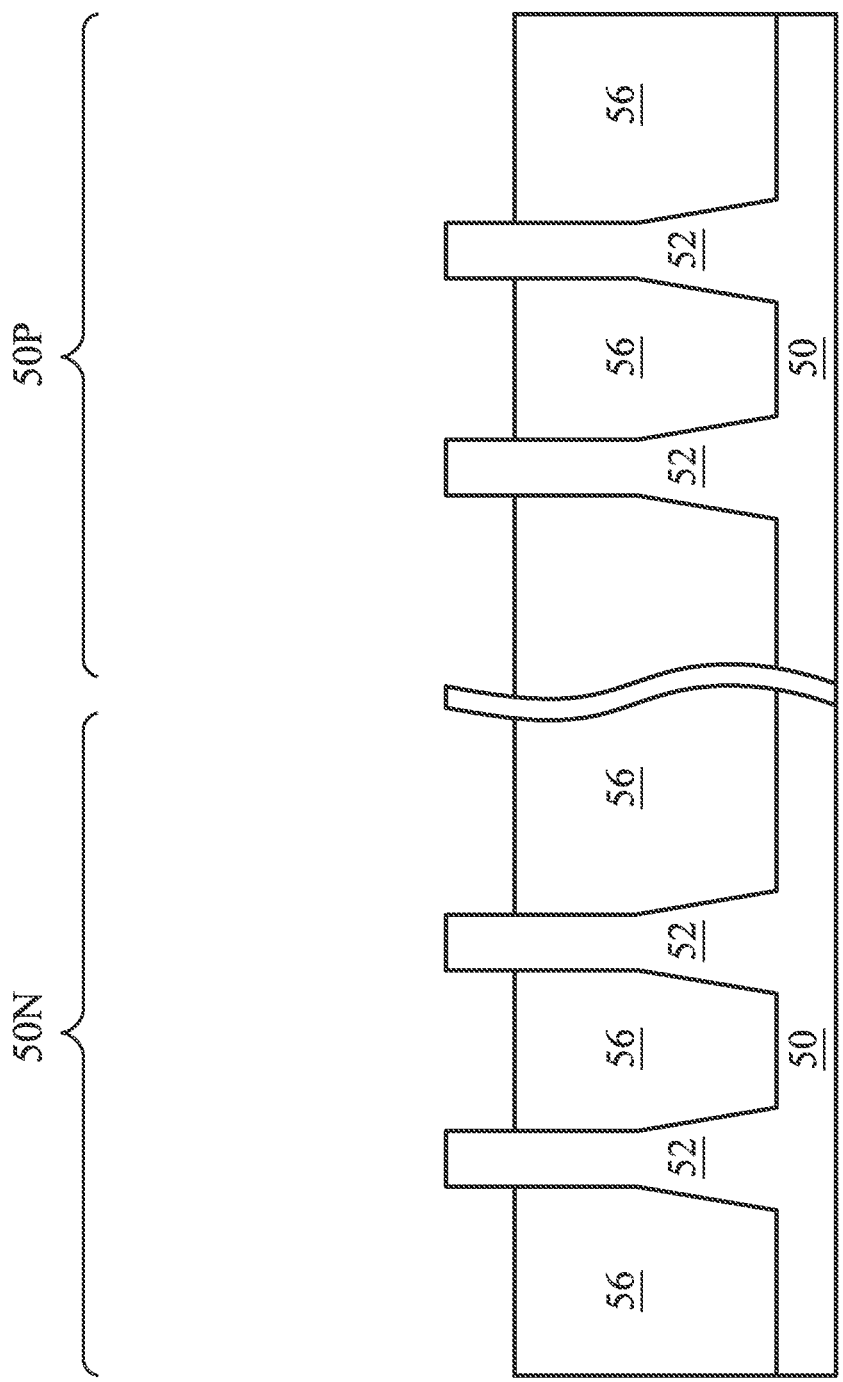

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
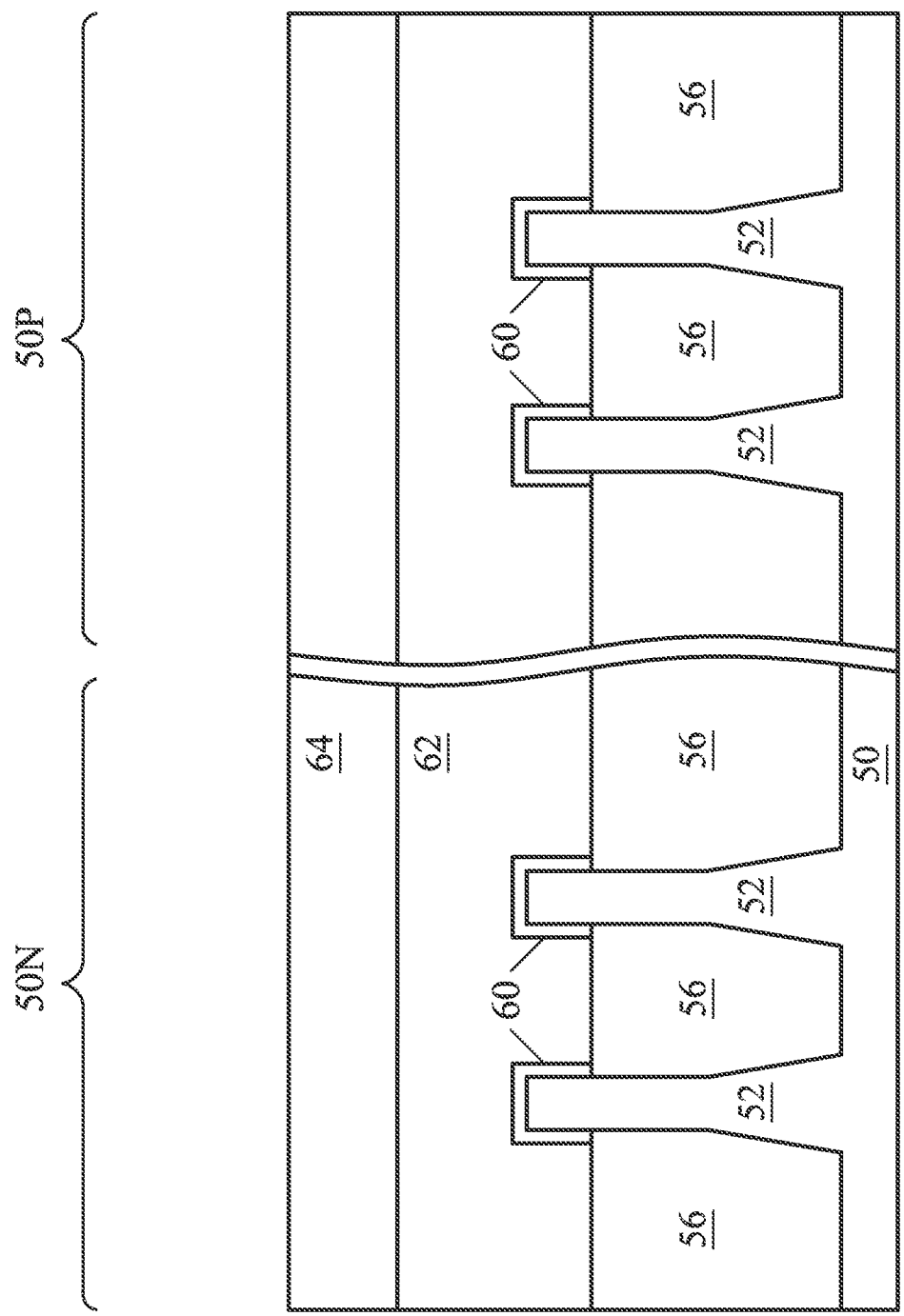

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 13B and FIGS. 16 through 22B illustrate various additional steps in the manufacturing of embodiment devices. These figures illustrate features in either of the region 50N and the region 50P. For example, the structures illustrated in these figures may be applicable to both the region 50N and the region 50P. Differences (if any) in the structures of the region 50N and the region 50P are described in the text accompanying each figure.

Figure 8B:
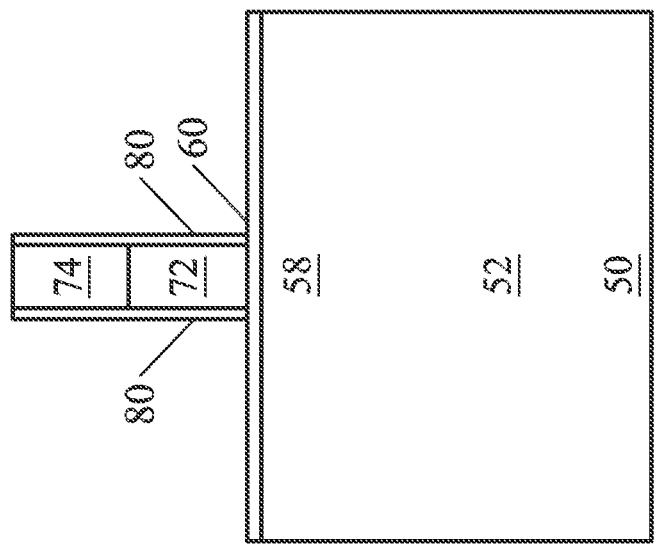
Figure 8A:
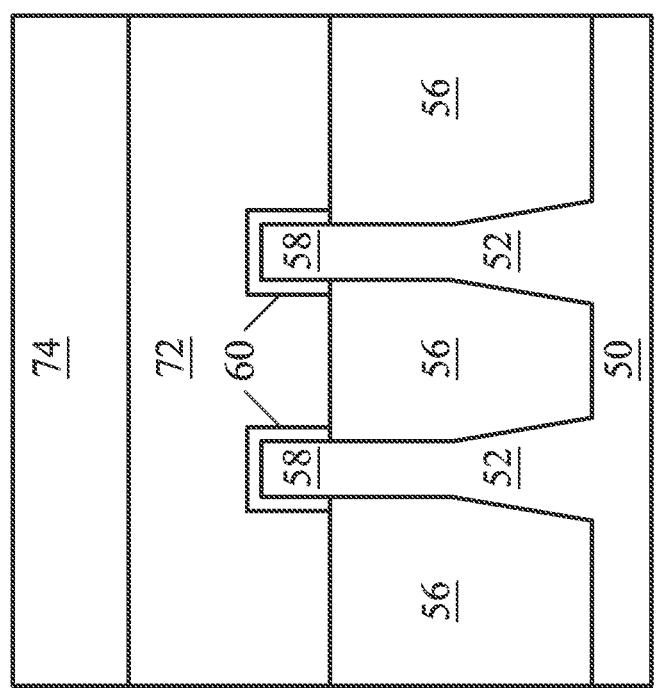

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
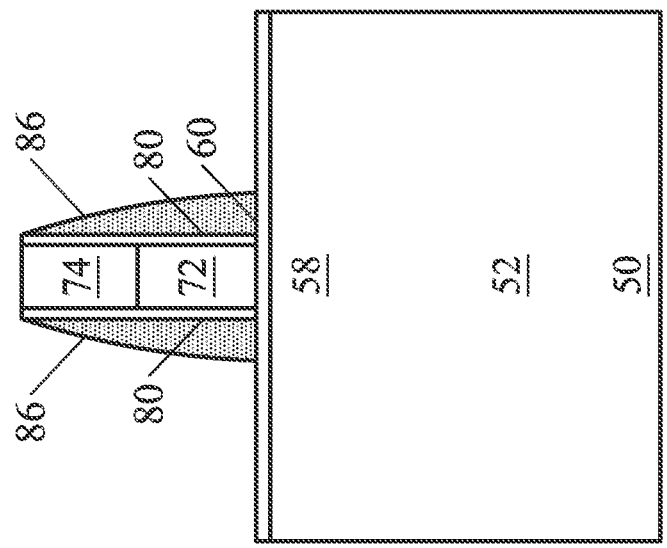
Figure 9A:
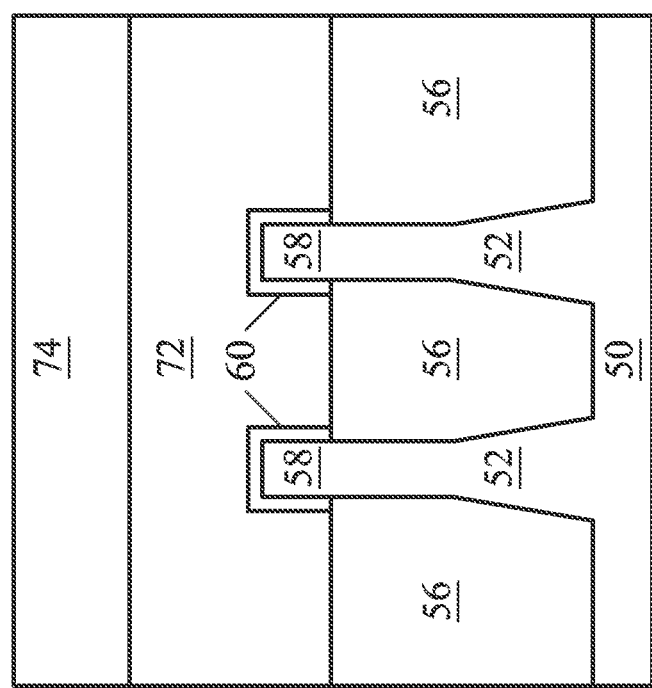

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like. The gate spacers 86, gate seal spacers 80, dummy gates 72, and masks 74 may be collectively referred to herein the "dummy gate structures."

It is noted that the above disclosure generally describes a process of forming spacers and LDD regions. Other processes and sequences may be used. For example, fewer or additional spacers may be utilized, different sequences of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

FIGS. 10A through 13B illustrate various steps in forming epitaxial source/drain regions 82 in the fins 52, in accordance with some embodiments. FIGS. 10C, 11, 12, and 13A-B are illustrated along reference cross-section C-C illustrated in FIG. 1. For clarity, some dimensions or proportions of the features shown in the FIGS. 10C through 13B may be different than as shown in other Figures. The epitaxial source/drain regions 82 in the region 50N, e.g., the NMOS region, may be formed by masking the region 50P, e.g., the PMOS region, and etching in the region 50N to form recesses 77 in the fins 52. Then, the epitaxial source/drain regions 82 in the region 50N are epitaxially grown in the recesses 77. The epitaxial source/drain regions 82 in the region 50P, e.g., the PMOS region, may be formed by masking the region 50N, e.g., the NMOS region, and etching in the region 50P to form recesses 77 in the fins 52. Then, the epitaxial source/drain regions 82 in the region 50P are epitaxially grown in the recesses 77. The epitaxial source/drain regions 82 may be formed using multiple deposition and etching processes, described in greater detail below.

Figure 10B:
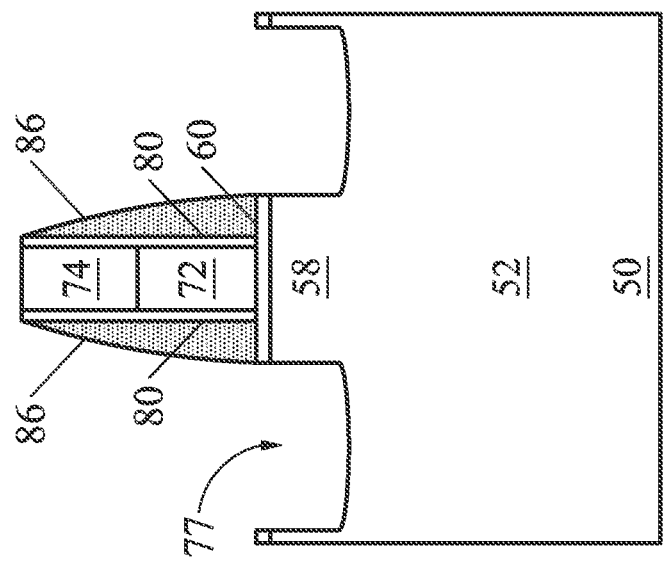
Figure 10A:
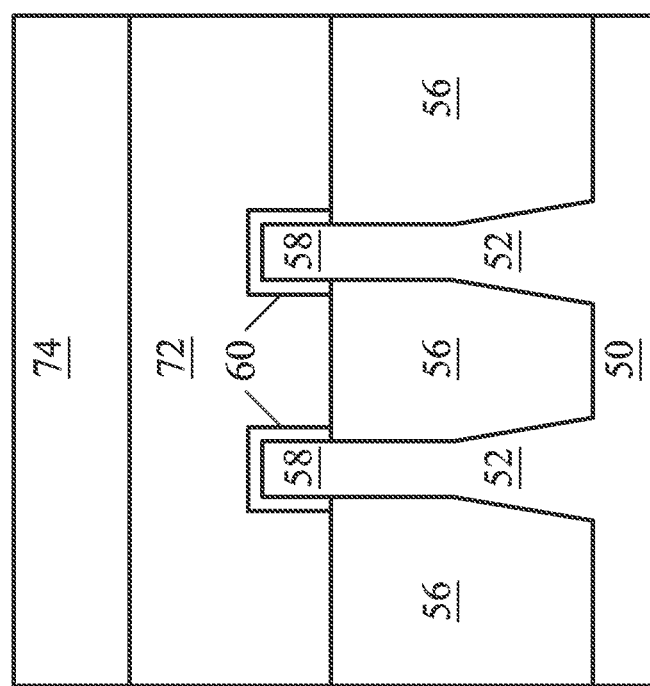
Figure 10C:
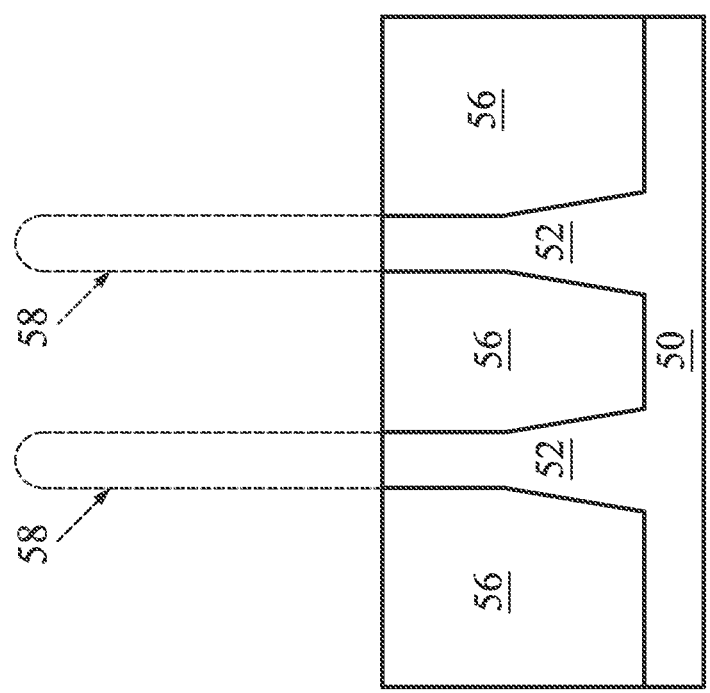

FIGS. 10A, 10B, and 10C illustrate the etching of the source/drain regions of the fins 52 to form recesses 77. The recesses 77 may be formed by etching using any acceptable etch processes, such as a dry etching process (e.g., RIE, NBE, or the like) or a wet etching process (e.g., tetramethylammonium hydroxide (TMAH), ammonium hydroxide (NH$_4$OH), or the like), or a combination thereof. The etch processes may be anisotropic. In some embodiments, material of the gate spacers 86 and/or the gate seal spacers 80 remains on the STI regions 56 between the adjacent fins 52 (not shown in the Figures). In some embodiments, the recesses 77 extend into the fins 52 below a top surface of the STI regions 56. In other embodiments, a portion of the fins 52 protrudes from the STI regions 56 after formation of the recesses 77. The STI regions 56 between adjacent fins 52 may be level as shown or may have a convex or a concave surface. In FIGS. 10C through 13B, the location of the channel regions 58 of the fins 52 under the dummy gate structure (e.g., the channel regions 58 that are not etched to form the recesses 77) are shown for reference.

Figure 11:
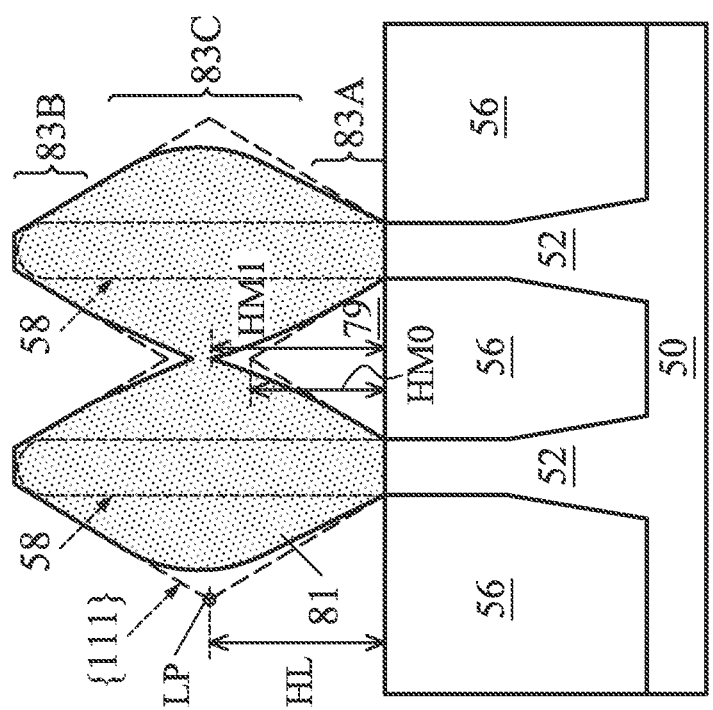
FIGS. 11, 12, 13A, and 13B are cross-sectional views of intermediate stages in the manufacturing of an epitaxial source/drain region of a FinFET device, in accordance with some embodiments.

Turning to FIG. 11, a first deposition process is performed to form an epitaxial region 81 in the recesses 77, in accordance with some embodiments. The epitaxial region 81 may be epitaxially grown using a suitable process such as CVD, metal-organic CVD (MOCVD), molecular beam epitaxy (MBE), liquid phase epitaxy (LPE), vapor phase epitaxy (VPE), selective epitaxial growth (SEG), the like, or a combination thereof. For example, the first deposition process may include a process performed at a pressure between about 5 Torr and about 300 Torr, or at a temperature between about 500° C. and about 800° C. In some embodiments, the first deposition process may include gases and/or precursors such as SiH$_4$, DCS, Si$_2$H$_6$, GeH$_4$, PH$_3$, AsH$_3$, B$_2$H$_6$, HCl, the like, or combinations thereof. The gases and/or precursors may be flowed into a processing chamber at a rate between about 10 sccm and about 2000 sccm. The first deposition process may be performed for a period of time between about 50 seconds and about 3000 seconds. Other deposition processes or process parameters may be used.

The epitaxial region 81 may include any acceptable material, such as appropriate for n-type FinFETs or p-type FinFETS. For example, if the fin 52 is silicon, the epitaxial region 81 in the region 50N may include materials exerting a tensile strain in the channel region 58, such as silicon, silicon carbide, phosphorous doped silicon carbide, silicon phosphide, or the like. If the fin 52 is silicon, the epitaxial region 81 in the region 50P may comprise materials exerting a compressive strain in the channel region 58, such as silicon-germanium, boron doped silicon-germanium, germanium, germanium tin, or the like. The epitaxial region 81 may have surfaces raised from respective surfaces of the fins 52 and may have facets.

As illustrated in FIG. 11, the epitaxial material formed in the adjacent fins 52 may merge to form a continuous epitaxial region 81. Air gaps 79 may be formed between and underneath the epitaxial material formed on adjacent fins 52. In some embodiments, in which the epitaxial region 81 is merged, the air gaps 79 may have a "merge height" HM1 above the STI regions 56 that is between about 5 nm and about 50 nm. During the first deposition process, surfaces of the epitaxial material may have facets of various crystalline orientations. For example, surfaces near the top of the channel regions 58 and surfaces near the bottom of the channel region 58 may have {111} facets. Other surfaces may have other facets, such as {110} facets, or may have a combination of facets, such as a combination of {111} facets and {110} facets, or other facets. In some embodiments, a greater flow rate of HCl during the deposition process may cause surfaces with {100} facets, surfaces with {110} facets, and/or surfaces with {111} facets to have more similar growth rates. Thus, increasing the flow rate of HCl during the deposition process may promote the growth of surfaces that have a combination of {100} facets, {110} facets, and/or {111} facets.

In some cases, during the first deposition process, the epitaxial region 81 grows laterally from each fin 52, with the boundaries of the growth being substantially determined by the formation of the {111} facets. In other words, the shape of the epitaxial region 81 is substantially determined by the {111} facets, and the maximum size (e.g., volume or cross-sectional area) of the epitaxial region 81 is substantially determined by the {111} facets. As an illustrative example, the {111} facets that substantially determine the growth boundaries of the epitaxial region 81 are indicated in FIG. 11 by the dashed outline labeled "{111}." Due to the growth of facets, the shape and size of the epitaxial region 81 is substantially confined within this dashed outline. Hence, the growth of the epitaxial region 81 may be "facet-limited."

During the first deposition process, the epitaxial material may initially form lower {111} facets near the bottom of the channel regions 58 and upper {111} facets near the top of the channel regions 58. As the first deposition process continues, the epitaxial material grows along these upper and lower {111} facets, with the lateral growth rate being greatly reduced beyond where the upper and lower {111} facets intersect. In this manner, the maximum lateral growth of the epitaxial material may be approximately defined by the upper and lower {111} facets. In FIG. 11, a point at which the {111} facets approximately define the boundary of the lateral growth of the epitaxial region 81 is indicated as point "LP." The LP point may have a height HL above the STI regions 56 between about 20 nm and about 50 nm, which may depend on the depth of the recesses 77 or the height of the exposed portions of the fins 52. In some cases, the growth rate of the epitaxial region 81 may become greatly reduced after the growth of the epitaxial region 81 has reached the LP point defined by the {111} facets. In some cases, the height HL may be about half the height of the recesses 77, or may be about half the height HF of the epitaxial region 82 (see FIG. 13B). The maximum lateral width of the epitaxial material may be approximately determined by the distance between opposite LP points, which may be between about 40 nm and about 100 nm in some embodiments. In cases in which the adjacent fins 52 are close enough (e.g., have a small enough pitch PF) such that the epitaxial material grown on the adjacent fins 52 have {111} facets that overlap, the epitaxial material may merge together into a continuous epitaxial region 81. Undersurfaces of the epitaxial material that are {111} facets merge at a height HM0 above the STI regions that is approximately defined by the intersection of the {111} facets, and which may depend on the pitch PF. In some embodiments, the height HM0 may be between about 10 nm and about 60 nm.

In some embodiments, the first deposition process is halted before the lateral growth of the epitaxial region 81 reaches the point LP. In this manner, the epitaxial region 81 may be formed with regions having surfaces with different crystalline orientations. For example, as shown in FIG. 11, lower regions 83A near the bottom of the channel regions 58 and upper regions 83B near the top of the channel regions 58 may have surfaces comprising {111} facets. This is also shown in FIG. 11 by the lower regions 83A and upper regions 83B having surfaces along the dashed outline "{111}" that indicates the growth-limiting {111} facets. Surfaces between the lower regions 83A and the upper regions 83B, such as the surfaces of middle regions 83C shown in FIG. 11, may have other facets, such as {110} facets, or may have a combination of facets, such as a combination of {111} facets and {110} facets, or other facets. The epitaxial material on each fin 52 may be separate or may be merged into a continuous epitaxial region 81, as shown in FIG. 11. Additionally, by halting the first deposition process in this manner, the epitaxial region 81 may be formed having a smaller cross-sectional area, which can reduce parasitic capacitance (e.g., Cgd) of the FinFET device, described in greater detail below. In some embodiments, the first deposition process is halted before facets growing along undersurfaces of the epitaxial material merge (e.g., at height HM0). In these embodiments, the epitaxial material may merge at a height HM1 that is greater than the height HM0.

Figure 12:
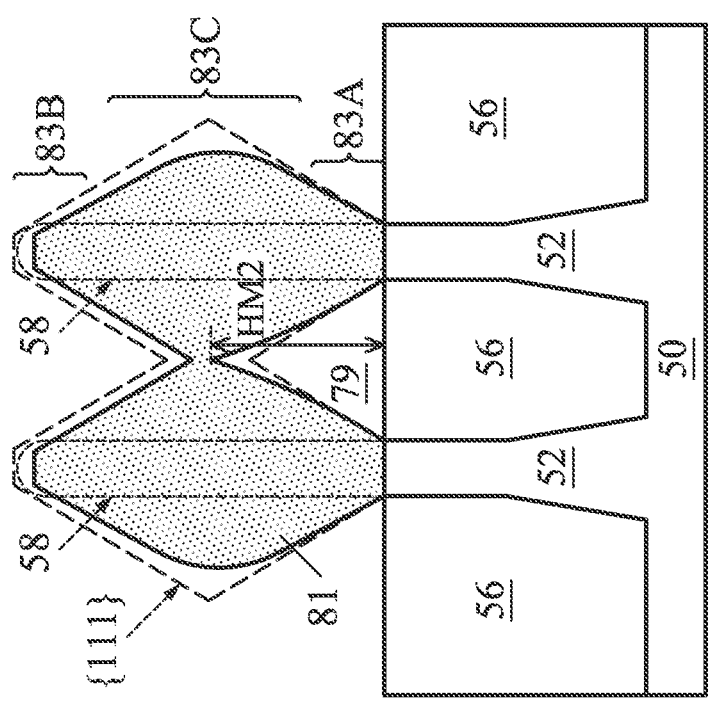

In FIG. 12, an etch back process is performed on the epitaxial region 81, in accordance with some embodiments. The etch back process may include, for example, an anisotropic dry etching process. The etch back process may include multiple gases and/or precursors, such as HCl, GeH$_4$, SiH$_4$, the like, or combinations thereof. The process gases may be flowed into a processing chamber at a rate between about 20 sccm and about 3000 sccm. The etch back process may include a process temperature in a range from about 600° C. to about 800° C., and may include a process pressure in a range from about 3 Torr to about 300 Torr. The etch back process may be performed for a period of time between about 1 seconds and about 300 seconds, such as about 50 seconds.

In some embodiments, the characteristics of the etch back process are controlled such that surfaces having {110} facets are etched at a greater rate than surfaces having {111} facets. For example, the etch back process may include gases and/or precursors such as HCl, Cl$_2$, H$_2$, N$_2$, the like, or combinations thereof. The etch back process may include a process pressure between 5 Torr and about 300 Torr, or a process temperature between about 600° C. and about 800° C. In some embodiments, the ratio of the etch rate of {111} facets and the etch rate of {110} facets may be controlled by controlling the process temperature of the etch back process. In some cases, {111} facets and {110} facets may have different activation energies for the etching reactions of the etch back process, and controlling the process temperature can increase or decrease the etch rate ratio due to the differences in the activation energies. In some embodiments, the etch back process etches {110} facets at a rate that is at least about 4 times greater than {111} facets. As such, the etch back process may etch the middle regions 83C more than the etch back process etches the lower regions 83A or the upper regions 83B, and thus may mostly etch in lateral directions. In this manner, middle regions 83C may have a flatter (e.g., less rounded or more vertical) profile after the etch back process. In some cases, the lower regions 83A and the upper regions 83B have substantially {111} faceted surfaces and the middle regions 83C have surfaces comprising {111} and {110} facets after the etch back process. In some cases, the lower regions 83A are etched less than the upper regions 83B, as shown in FIG. 12.

In some embodiments, the epitaxial material on the fins 52 becomes unmerged by the etch back process. In other embodiments, the epitaxial material remains merged as an epitaxial region 81 after the etch back process, as shown in FIG. 12. In some embodiments, due to the etch back process, the merge height HM1 of the air gaps 79 may increase. For example, after the etch back process, the air gaps 79 may have a merge height HM2 above the STI regions 56 that is between about 10 nm and about 60 nm, which may be higher than the height HM1 of the air gaps 79 prior to the etch back process. In this manner, the etch back process may decrease the overall cross-sectional area of the epitaxial region 81, which may include increasing the merge height of the merged epitaxial material of the epitaxial region 81. In some cases, having epitaxial material with a small or incomplete merged region can allow for gas phase etchants to reach the underside (e.g., adjacent the air gaps 79) of the epitaxial region 81 more easily and allow for increased etching of the underside of the epitaxial region 81. Additionally, the use of an anisotropic etch back process as described previously may allow for increased etching of the underside of the epitaxial region 81 due to the unbiased gas phase etchants being able to reach the underside of the epitaxial region 81 more easily.

Figure 13A:
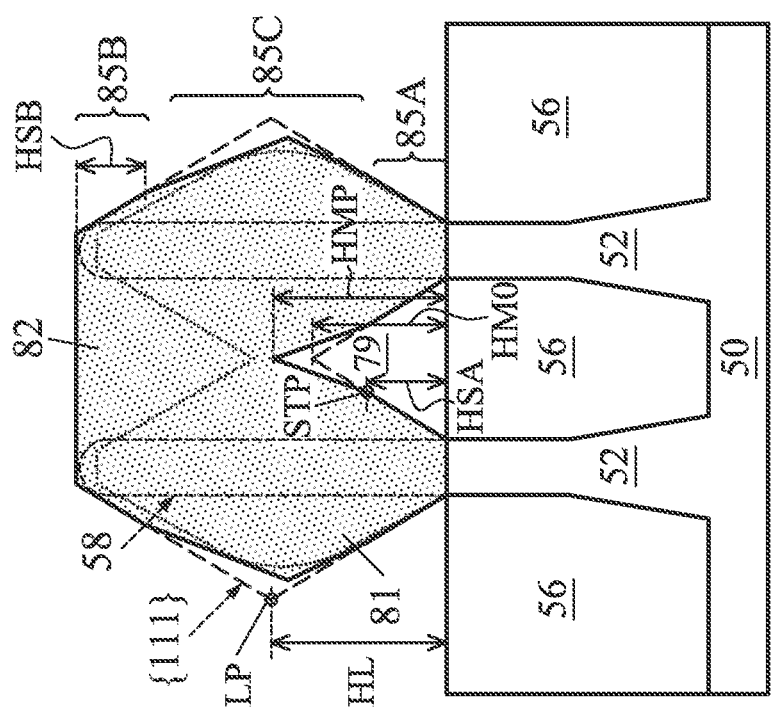
Figure 13B:
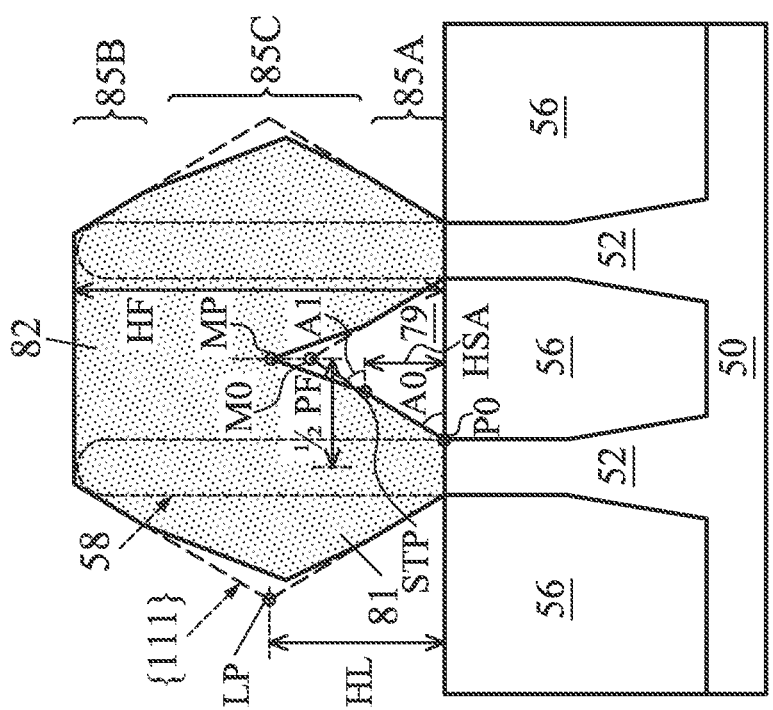

In FIGS. 13A and 13B, a second deposition process is performed to deposit epitaxial material on the epitaxial region 81 to form an epitaxial region 82, in accordance with some embodiments. FIGS. 13A and 13B illustrate the same cross-sectional view, with features labeled separately on each Figure for clarity. The epitaxial material of the epitaxial region 82 may be epitaxially grown using a suitable process such as CVD, MOCVD, MBE, LPE, VPE, SEG, the like, or a combination thereof. The epitaxial material deposited on the epitaxial region 81 may include materials similar to those described above as deposited during the first deposition process. For example, the second deposition process may include a process performed at a pressure between about 5 Torr and about 300 Torr or at a process temperature between about 500° C. and about 800° C. In some embodiments, the second deposition process may include gases and/or precursors such as $SiH_4$, DCS, $Si_2H_6$, $GeH_4$, $PH_3$, $AsH_3$, $B_2H_6$, HCl, the like, or combinations thereof. The gases and/or precursors may be flowed into a processing chamber at a rate between about 10 sccm and about 2000 sccm. The second deposition process may be performed for a period of time between about 50 seconds and about 3000 seconds. Other deposition processes or process parameters may be used. The epitaxial material deposited by the second deposition process may be similar to that deposited by the first deposition process or may be different, such as having a different semiconductor composition or having a different doping. The epitaxial regions 82 may have surfaces raised from respective surfaces of the fins 52 and may have facets.

As illustrated in FIGS. 13A-B, the epitaxial material is deposited over the epitaxial region 81 and between the fins 52 such that the epitaxial region 82 is a continuous region. In some cases, the growth rate of epitaxial material between the fins 52 may be greater than the growth rate of epitaxial material on other surfaces, especially if the epitaxial material is merged. The epitaxial region 82 may have a substantially flat top surface, or the top surface may be concave, convex, or "wavy." In some embodiments, the epitaxial material deposited by the second deposition process may have facets of various crystalline orientations. For example, lower regions 85A of the epitaxial region 82 may have surfaces substantially having {111} facets. In some embodiments, the lower regions 85A may extend a height HSA that is between about 5 nm and about 60 nm. In some embodiments, upper regions 85B of the epitaxial region 82 may have surfaces substantially having {111} facets. In some embodiments, the upper regions 85B may extend a height HSB that is between about 0 nm and about 30 nm. In some cases, having an epitaxial region 81 with a small or incomplete merged region can allow precursors to reach the underside (e.g., adjacent the air gaps 79) of the epitaxial region 81 more easily, and thus may allow some epitaxial material to be deposited on the underside of the epitaxial region 81. In some cases, some epitaxial material may be deposited near the bottom of the lower regions 85A.

In some embodiments, the middle regions 85C of the epitaxial region 82 that are between the lower regions 85A and the upper regions 85B have surfaces comprising {110} facets. The middle regions 85C may also comprise a combination of {110} facets and {111} facets, or other facets. The surfaces of the lower regions 85A deviate from {111} facets at the boundary between the lower regions 85A and the middle regions 85C, which, for example, may be at or near the height HSA. An example boundary point between the lower regions 85A and the middle regions 85C is shown in FIG. 13A as the "slope turning point" STP. In some embodiments, the middle regions 85C may have a sidewall slope that is greater than the sidewall slope of the lower regions 85A and/or the sidewall slope of the upper regions 85B. The location of STP (e.g., the height HSA) on the epitaxial region 82 may be controlled by controlling the parameters of the first deposition process, the etch back process, and/or the second deposition process. In some embodiments, the length of the {111} facets in lower regions 85A may depend on the amount of {111} faceted material deposited by the first deposition process and/or the amount of {111} faceted material deposited by the second deposition process. For example, performing the first deposition process and/or the second deposition process for longer durations of time may grow more {111} faceted material in the lower regions 85A and thus increase the height HSA of STP. As another example, performing the etch back process for a longer duration of time may etch more of the material of the lower regions 83A (see FIG. 12), and thus may decrease the height HSA of STP.

In some cases, once the epitaxial region 82 has merged significantly, the growth rate of the epitaxial material on the underside of the epitaxial region 82 may be greatly reduced. In this manner, the location of STP may be approximately determined by the merging of the epitaxial region 82. In some cases, if the growth rate of {111} facets is slower than the growth rate of {110} facets, the boundary of the epitaxial material 81 as it grows is mostly determined by surfaces with {111} facets. In this situation, a relatively slower growth rate of {111} facets can result in the location of STP being closer to the merge point MP (described in greater detail below), and the HSA thus being relatively high. In some cases, having a growth rate of {111} facets that is closer to a growth rate of {110} facets may result in the location of STP being farther from the merge point MP, and HSA thus being relatively low. In this manner, the location of STP and the height of HSA may be controlled by controlling the relative growth rates (e.g., the ratio of the growth rates) of {111} facets and {110} facets. These are examples, and the location of STP or the height HSA may be controlled by controlling different parameters or different combinations of parameters.

The techniques described herein can reduce the overall cross-sectional area of the epitaxial region 82. By reducing the overall-cross sectional area of the epitaxial regions 82, the gate-to-drain capacitance (Cgd) of a FinFET device may be reduced, which can improve performance of the FinFET device. For example, RC delay of the FinFET device may be reduced and the response speed of the FinFET device may be improved. In some embodiments, the cross-sectional area of the epitaxial region 82 may be reduced to between about 5% and about 60% of the maximum facet-limited cross-sectional area, shown by the dashed outline labeled "{111}." In some embodiments, the maximum facet-limited cross-sectional area may be between about 1000 $nm^2$ and about 6000 $nm^2$, and the cross-sectional area of the epitaxial region 82 may be between about 500 $nm^2$ and about 5000 $nm^2$. Other cross-sectional areas of the epitaxial region 82 are possible.

In some embodiments, by controlling the first deposition process, the etch back process, and the second deposition process, the cross-sectional area of the epitaxial regions 82 may be reduced by reducing the lateral width of the epitaxial region 82. For example, the lateral width of the epitaxial region 82 may be reduced to between about 5% and about 70% of the maximum facet-limited lateral-width (e.g., between opposite LP points). In some embodiments, the lateral width of the epitaxial region 82 may be between about 40 nm and about 80, although other lateral widths may be achieved. Additionally, the cross-sectional area of the epitaxial regions 82 may be reduced by increasing the height of the air gaps 79. For example, after the second deposition process, the air gaps 79 may have a merge height HMP above the STI regions 56 that is between about 15 nm and about 60 nm. By increasing the height HMP, the cross-sectional area of the epitaxial region 82 is reduced, and the capacitance Cgd may be correspondingly reduced. In some cases, the height of the air gaps 79 may be vertically closer to a top surface of the epitaxial regions 82 than to the STI regions 56. In some embodiments, the second deposition process deposits epitaxial material on portions of the underside of the epitaxial region 81 such that the height HMP is less than the height HM2 (see FIG. 12). In other embodiments, the second deposition process deposits no epitaxial material on portions of the underside of the epitaxial region 81 such that the height HMP is about the same as the height HM2 (see FIG. 12). In some embodiments, the height HMP may be greater than the height HM1 (see FIG. 11). In some embodiments, the merge height HMP may be greater than the facet-limited merge height HM0. For example, the height HMP may be greater than the height HM0 by between about 3 nm and about 15 nm. In some embodiments, the height HMP may be greater than the height HL, though in other embodiments, the height HMP may be about the same or less than the height HL. Other dimensions, heights, or relative heights are possible.

Turning to FIG. 13B, points on the sidewall of the air gap 79 are labeled for reference. Point P0 indicates a bottom point of the epitaxial region 82, point STP indicates the "slope-turning point" as described previously, and point MP indicates the "merge point" at the top of the air gap 79. Additionally, point M0 indicates the "merge point" of the facet-limited cross-sectional area (shown by the dashed outline labeled "{111}"). As shown in FIG. 13B, M0 and MP are laterally located approximately halfway between the adjacent fins 52. In some embodiments, a first vertical distance from a top surface of the epitaxial regions 82 to MP is less than half of a second vertical distance from the top surface of the epitaxial regions 82 to the STI regions 56.

Figure 14B:
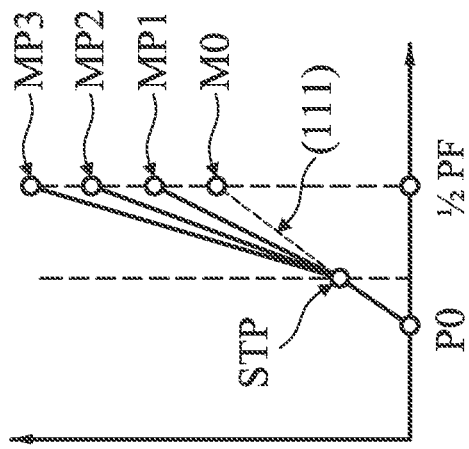
FIGS. 14A and 14B illustrate a graph of slope angle versus sidewall position for an epitaxial source/drain region of a FinFET device and a graph of profiles of an epitaxial source/drain region of a FinFET device, in accordance with some embodiments.
Figure 14A:
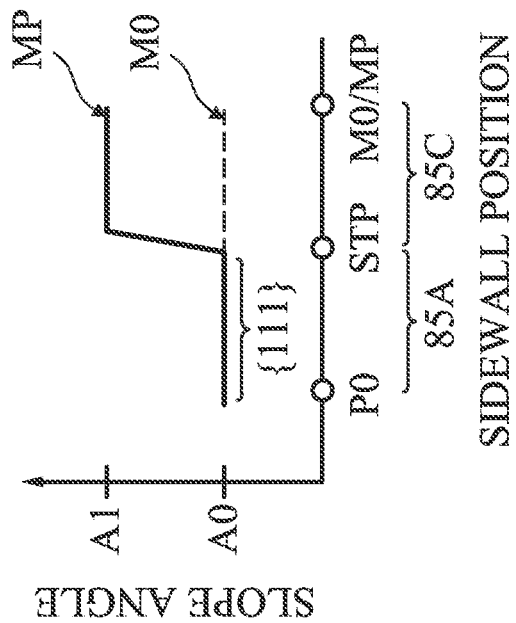

Due to the different faceting between the lower regions 85A and the middle regions 85C, the sidewall slope of the epitaxial region 82 changes at or near the "slope-turning point" STP. As an illustrative example, FIG. 14A shows a graph of slope angle vs. sidewall position for the points P0, STP, MP, and M0 shown in FIG. 13B. The sidewall of the epitaxial region 82 from P0 to STP in a lower region 85A has a slope angle A0 of about 54.7°, corresponding to the crystalline plane of a {111} facet. From STP to MP in a middle region 85C, the sidewall has a slope angle A1, which may be an angle between about 54.7° and about 90°, such as about 78°. The sidewall from STP to MP may have more than one slope angle or may have a varying slope angle, and the transition between slopes angles near STP may be abrupt or gradual. FIG. 14B shows a graph of profiles of epitaxial regions 82 corresponding to a portion of the cross-sectional view from P0 to the merging at ½PF as shown in FIG. 13B. The profile of the epitaxial region 82 from P0 to STP corresponds to the crystalline plane of a {111} facet. If the profile between P0 and ½PF were also along the {111} plane, the profile would follow the line from STP to M0 and have a corresponding slope angle of about 54.7°. However, due to the change in slope near STP, the profile has a greater slope between STP and the merge point MP. FIG. 14B shows an abrupt profile slope change at STP, but the profile change may be gradual or curved. As illustrative examples, four possible merge points MP1, MP2, MP3, and MP4 are shown in FIG. 14B, each having an increasingly greater profile slope from STP. The techniques described herein allow for the profile slope between STP and the merge point (e.g., MP1, MP2, MP3, or MP4) to be greater than a slope corresponding to a {111} facet, and thus can form a higher merge point. For example, the profile slope from STP to MP3 is greater than the profile slope from STP to MP1, and thus the merge point MP3 is higher than the merge point MP1, and both are higher than the merge point M0. In this manner, the shape and slopes of an epitaxial region may be controlled to increase the merge height of that epitaxial region. As shown in FIGS. 13B and 14A-B, the middle regions 85C have a greater slope angle than the lower regions 85A, and thus MP is higher than M0.

Figure 15:
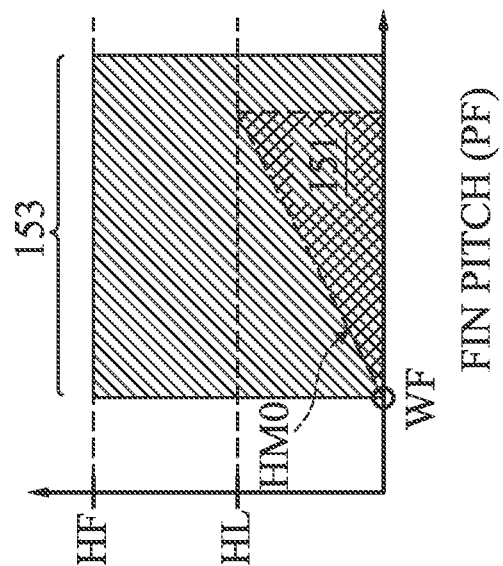
FIG. 15 illustrates a graph of merge heights versus fin pitch for an epitaxial source/drain region of a FinFET device, in accordance with some embodiments.

By controlling the parameters of the first deposition process, the second deposition process, and the etch back process to control the slope angle A1 and the sidewall position of the slope-turning point STP, the height HMP of the merge point MP may be controlled. For example, as described previously, the first deposition process and/or the second deposition process may be controlled to reduce formation of facets in upper and lower regions, or the etch back process may be controlled to increase the slope angle A1 by etching {110} facets at a greater rate than {111} facets. Other examples are possible. Additionally, as described previously, controlling the temperature during deposition of epitaxial material can control the relative growth rates of {111} facets and {110} facets, which can control the location of STP, the location of MP, or the proportion of facets that determine the slope angle A1. The location of MP can also be determined by controlling the location of STP, controlling the slope angle A1, or choosing a particular fin pitch PF. As an illustrative example, FIG. 15 shows the range of possible merge heights HMP of an epitaxial region 82 for a given fin pitch PF. For facet-limited growth, the merge height HMP is limited to the heights within zone 151, in which the merge height HMP equals the height HM0 and the maximum merge height HMP is height HL. Using the techniques described herein, the formation of the epitaxial region 82 may be controlled to have any merge height HMP within zone 153, which includes the heights within zone 151. As shown the techniques described herein allow for greater flexibility of design for the epitaxial regions 82 including reducing the cross-sectional area.

Figure 16:
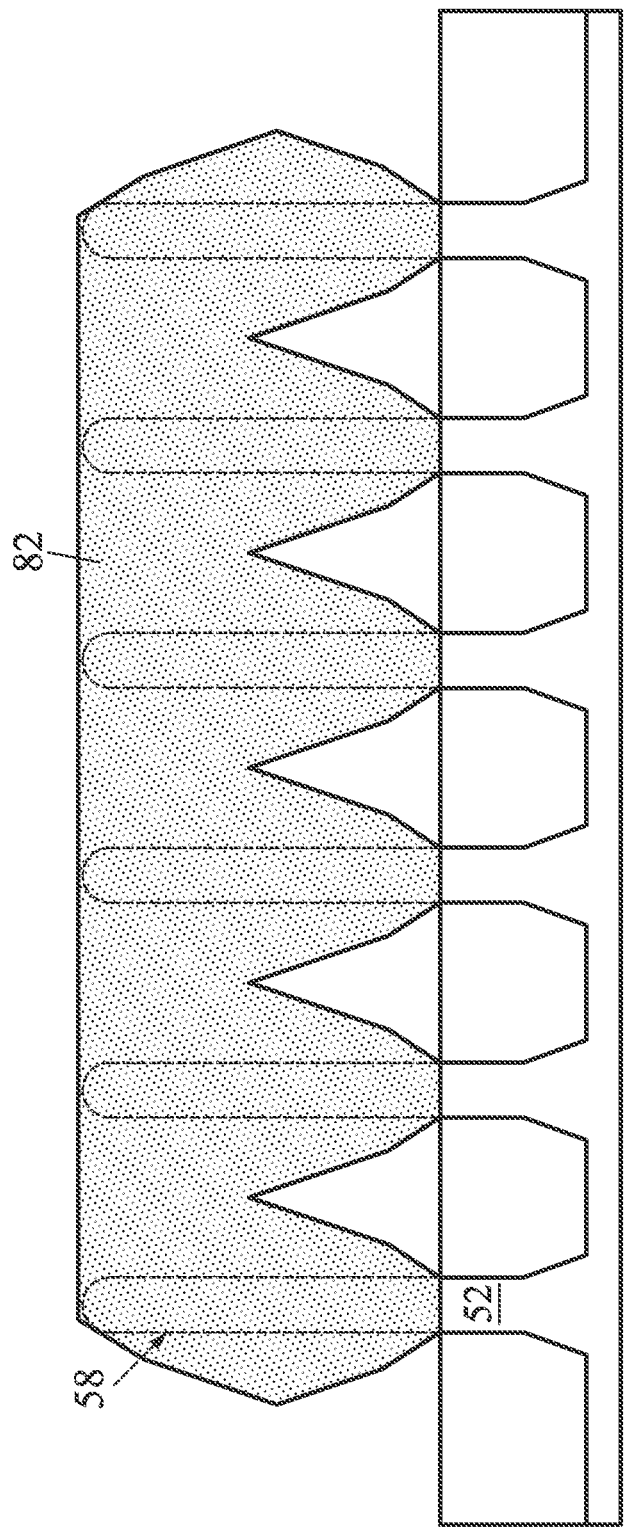
FIG. 16 is a cross-sectional view of an intermediate stage in the manufacturing of an epitaxial source/drain region of a FinFET device, in accordance with some embodiments.

In some embodiments, an epitaxial region 82 may be formed from merged epitaxial material grown in more than two fins 52. An example multi-fin embodiment is shown in FIG. 16, though an epitaxial region 82 may be formed over more or fewer fins 52 than shown. The techniques described herein may be used to reduce the cross-sectional area of the epitaxial region 82 in this and other multi-fin embodiments. It should be noted that other techniques of controlling a slope-turning point STP and/or increasing the merge height HMP to reduce the cross-sectional area of an epitaxial region 82 may be used, including but not limited to performing additional deposition processes or etch back processes.

In some embodiments, the spacer etch used to form the gate spacers 86 may be adjusted to remove the spacer material to allow the epitaxially grown material to extend to the surface of the STI region 56, as shown in FIGS. 13A-B. In other embodiments, the gate spacers 86 are formed covering a portion of the sidewalls of the fins 52 that extend above the STI regions 56 thereby blocking the epitaxial growth on those portions. The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 17A:
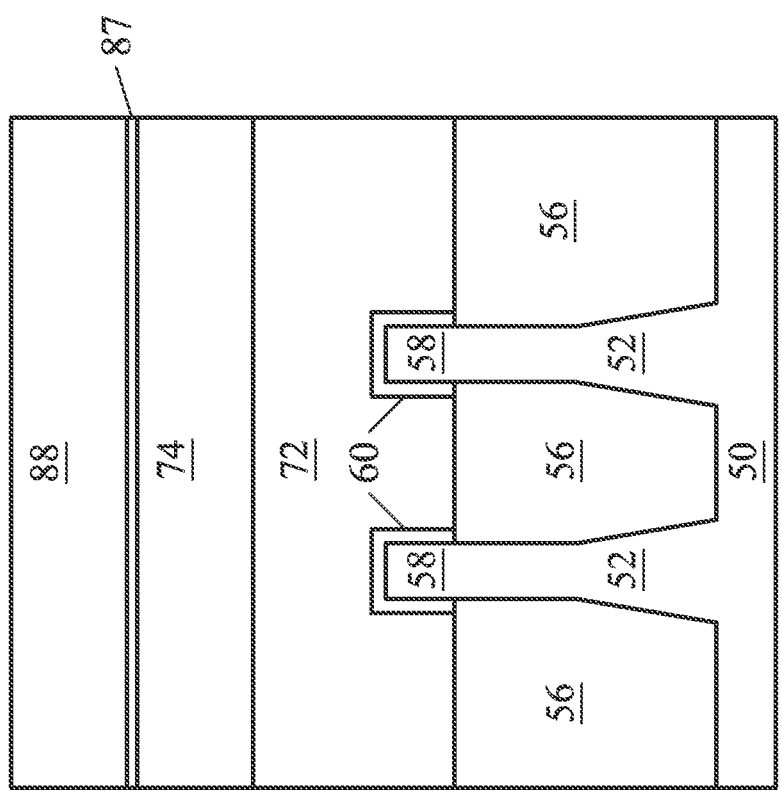
Figure 17B:
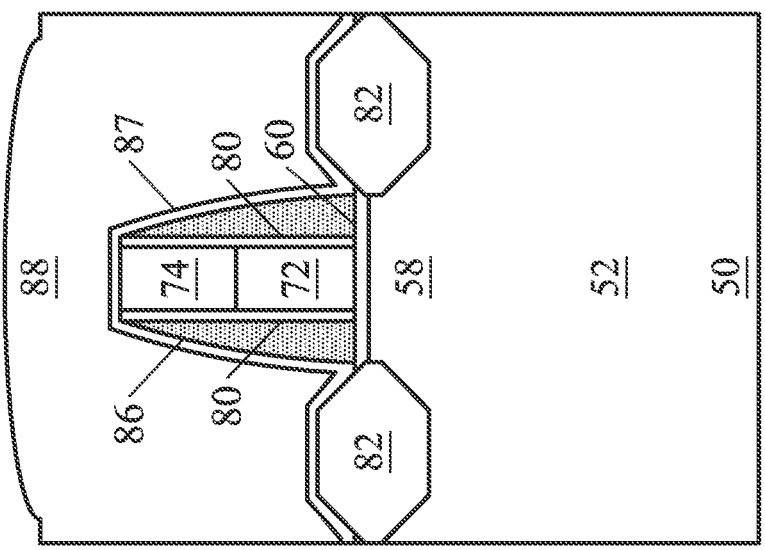

In FIGS. 17A and 17B, a first interlayer dielectric (ILD) 88 is deposited over the structure. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88. In some embodiments, the air gap 79 remains empty (e.g., free of the first ILD 88 or the CESL 87). In other embodiments, the first ILD 88 or the CESL 87 may be deposited within the air gap 79.

Figure 18B:
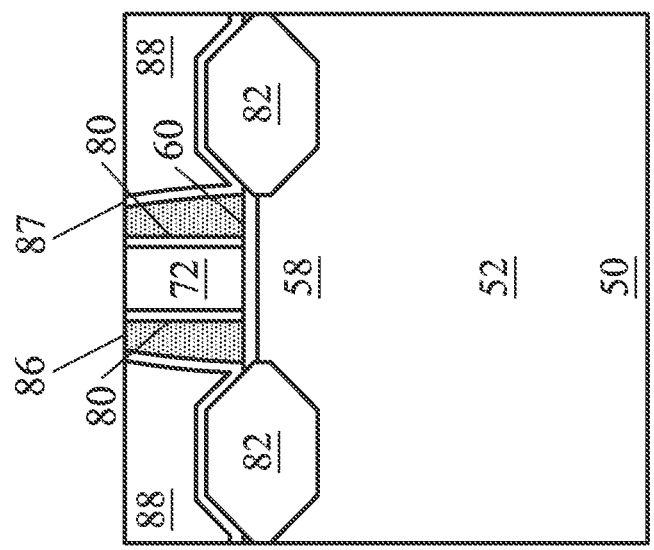
Figure 18A:
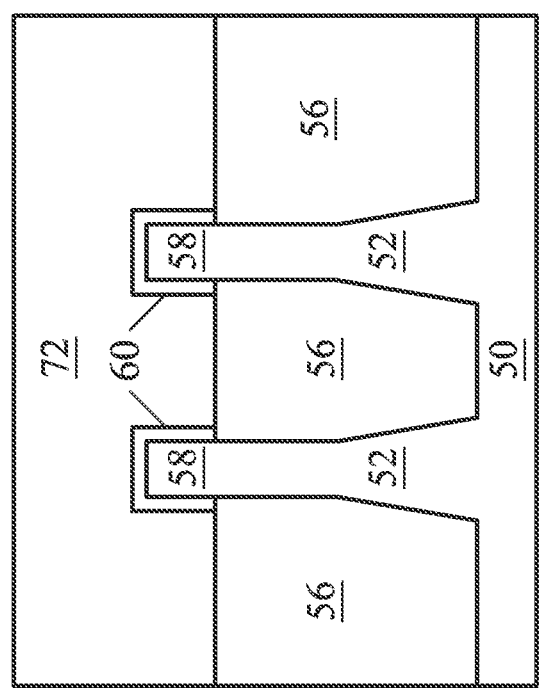

In FIGS. 18A and 18B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 19B:
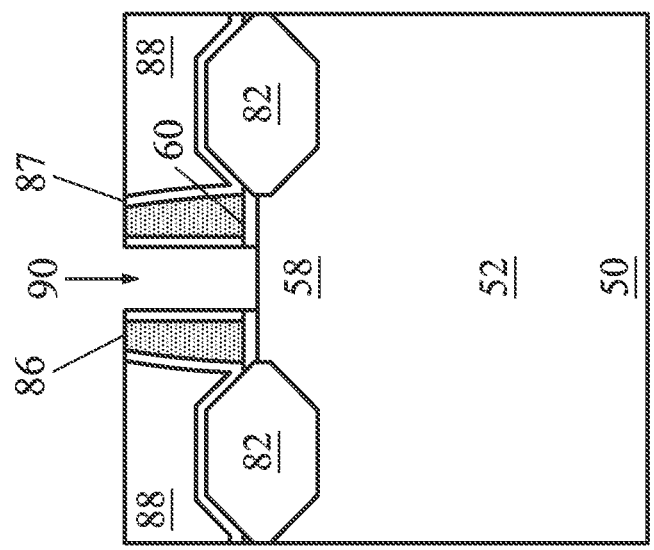
Figure 19A:
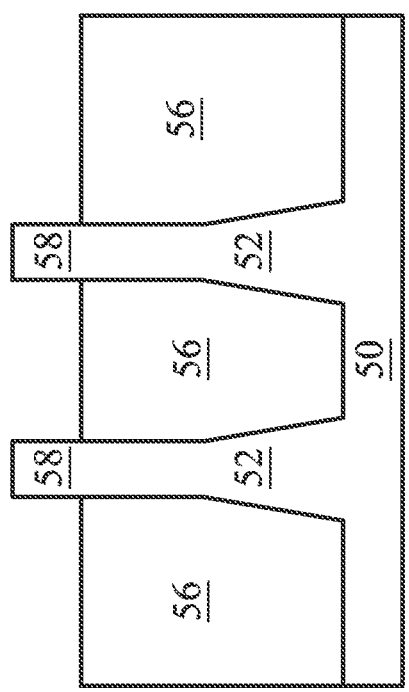

In FIGS. 19A and 19B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 20B:
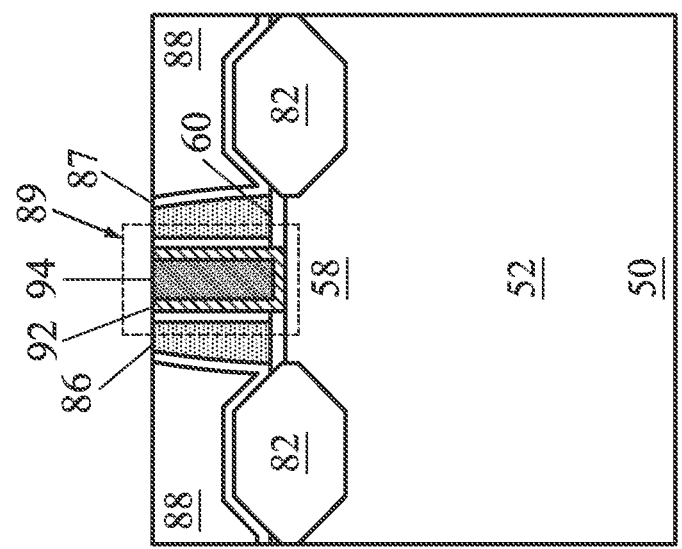
Figure 20A:
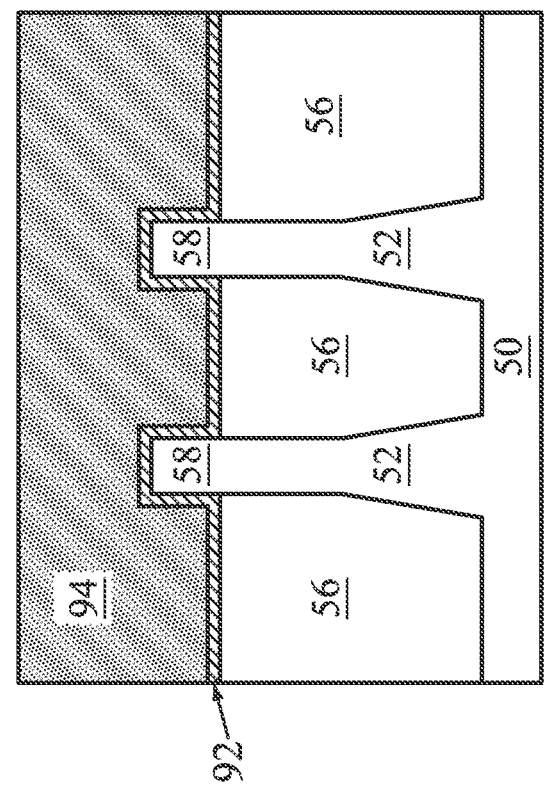
Figure 20C:
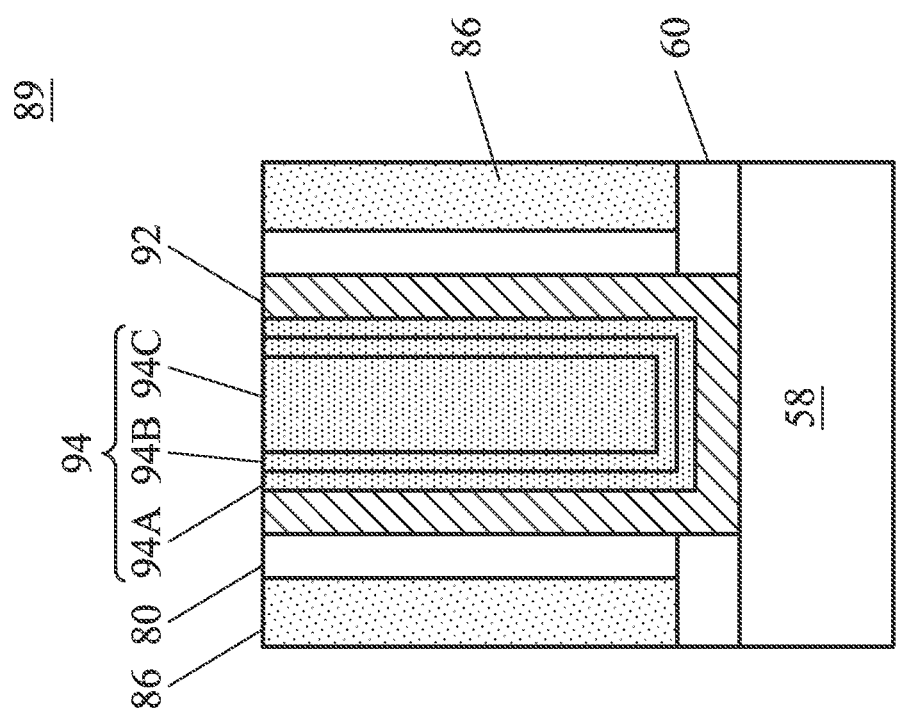

In FIGS. 20A and 20B, gate dielectric layers 92 and gate electrodes 94 are formed for replacement gates. FIG. 20C illustrates a detailed view of region 89 of FIG. 20B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 21B:
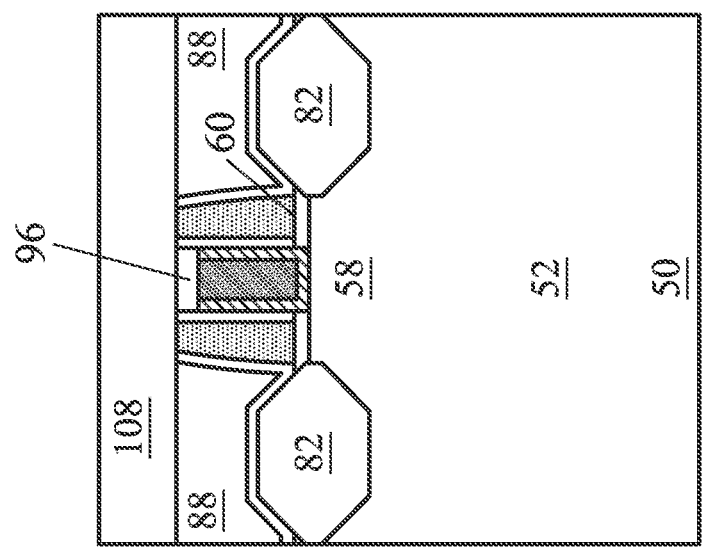
Figure 21A:
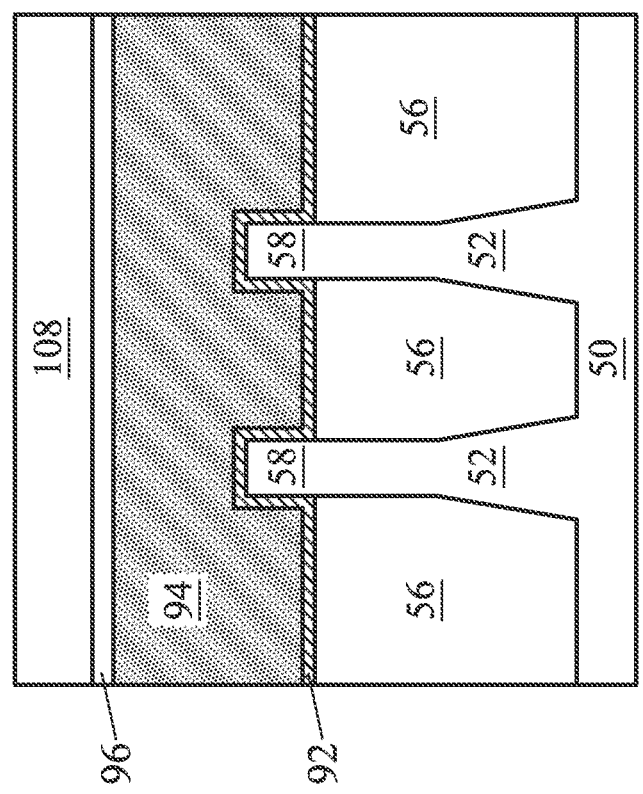

In FIGS. 21A and 21B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 21A and 21B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (see FIGS. 22A-B) penetrate through the gate mask 96 to contact the top surface of the recessed gate electrode 94.

In FIGS. 22A and 22B, gate contacts 110 and source/drain contacts 112 are formed through the second ILD 108 and the first ILD 88, in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Embodiments described can provide advantages. For example, the techniques described herein can allow for adjacent source/drain epitaxial regions of a FinFET device to merge farther from the substrate, which can reduce the overall cross-sectional area of the merged source/drain epitaxial region. Additionally, a merged epitaxial source/drain region may be formed having fewer faceted surfaces, which reduces the cross-sectional area relative to a merged epitaxial source/drain region with larger facets or that is facet-limited. Reducing the area of the merged epitaxial source/drain region in this manner can reduce the parasitic capacitance between the gate stack and the epitaxial source/drain region (e.g., Cgd), which can allow for improved device speed (e.g., faster on/off switching speed in a ring-oscillator device or the like), reduced RC delay effects, or a reduction of other performance issues due to parasitic capacitances. In some embodiments, the epitaxial source/drain regions are formed by first growing a first epitaxial layer, then performing an etch back process to increase the merge height, and then growing a second epitaxial layer.

In accordance with some embodiments of the present disclosure, a device includes a first fin and a second fin extending from a substrate, the first fin including a first recess and the second fin including a second recess, an isolation region surrounding the first fin and surrounding the second fin, a gate stack over the first fin and the second fin, and a source/drain region in the first recess and in the second recess, the source/drain region adjacent the gate stack, wherein the source/drain region includes a bottom surface extending from the first fin to the second fin, wherein a first portion of the bottom surface that is below a first height above the isolation region has a first slope, and wherein a second portion of the bottom surface that is above the first height has a second slope that is greater than the first slope. In an embodiment, the first portion of the bottom surface has a {111} crystalline plane. In an embodiment, the second slope is between 54.7° and 90°. In an embodiment, a first vertical distance from a top surface of the source/drain region to the bottom surface is less than half of a second vertical distance from the top surface of the source/drain region to the bottom of the first recess. In an embodiment, a top surface of the source/drain region extends over the first fin and the second fin is flat. In an embodiment, the second portion of the bottom surface includes facets of at least two different crystalline planes. In an embodiment, the source/drain region further includes opposite sidewalls, wherein below the first height, the sidewalls are facets of a {111} crystalline plane. In an embodiment, upper sidewalls of the source/drain region that extend from a second height above the isolation region to a top surface of the source/drain region are facets of a {111} crystalline plane, wherein the second height is above the first height. In an embodiment, between the first height and the second height, the sidewalls include surfaces having a third slope that is greater than the first slope.

In accordance with some embodiments of the present disclosure, a structure includes a first fin over a semiconductor substrate, a second fin over the semiconductor substrate, the second fin being adjacent the first fin, an isolation region surrounding the first fin and the second fin, a gate structure along sidewalls and over upper surfaces of the first fin and the second fin, and a source/drain region on the first fin and the second fin adjacent the gate structure, the source/drain region including an undersurface between the first fin and the second fin, wherein the undersurface includes a lower surface and an upper surface, wherein the lower surface is a facet of a first crystalline plane that extends from the bottom of the undersurface to a facet of a second crystalline plane that is a first height above the isolation region, wherein the upper surface extends from the first height to the uppermost portion of the undersurface, wherein the upper surface includes facets of the first crystalline plane and of the second crystalline plane. In an embodiment, the structure includes an air gap between the first fin and the second fin that is bounded by the undersurface. In an embodiment, the uppermost portion of the undersurface is vertically closer to a top surface of the source/drain region than to the isolation region. In an embodiment, the upper surface has a greater sidewall slope than the lower surface. In an embodiment, the source/drain region includes a sidewall surface opposite the first fin from the second fin, wherein a first portion of the sidewall surface extending from a bottom surface of the source/drain region is a facet of the first crystalline plane. In an embodiment, a second portion of the sidewall surface extending from a top surface of the source/drain region is a facet of the first crystalline plane. In an embodiment, a third portion of the sidewall surface between the first portion and the second portion includes facets of the first crystalline plane and facets of the second crystalline plane.

In accordance with some embodiments of the present disclosure, a method includes forming fins protruding from a semiconductor substrate, forming an isolation region surrounding the fins, forming a gate structure over the fins, and forming an epitaxial source/drain region adjacent the gate structure and extending over the fins, including performing a first deposition process to deposit a first epitaxial material on the fins, wherein bottom surfaces of the first epitaxial material on adjacent fins merge at a first height above the isolation region, performing an etching process on the first epitaxial material, wherein the etching process etches bottom surfaces of the first epitaxial material, and after performing the etching process, performing a second deposition process to deposit a second epitaxial material on the first epitaxial material, the epitaxial source/drain region including the first epitaxial material and the second epitaxial material, wherein after performing the second deposition process, bottom surfaces of the epitaxial source/drain region between adjacent fins extend a second height above the isolation region that is greater than the first height. In an embodiment, the etching process etches {110} surfaces at a greater rate than {111} surfaces. In an embodiment, after performing the second deposition process, surfaces of the epitaxial source/drain region extending from the isolation region to a third height are {111} facets, wherein the third height is less than the first height. In an embodiment, the etching process reduces a lateral width of the first epitaxial material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a plurality of fins protruding from a semiconductor substrate;
   forming an isolation region surrounding the plurality of fins;
   forming a gate structure over the plurality of fins; and
   forming an epitaxial source/drain region adjacent the gate structure and extending over the plurality of fins, comprising:
      performing a first deposition process to deposit a first epitaxial material on the plurality of fins, wherein bottom surfaces of the first epitaxial material on adjacent fins merge at a first height above the isolation region;
      performing an etching process on the first epitaxial material, wherein the etching process etches bottom surfaces of the first epitaxial material; and
      after performing the etching process, performing a second deposition process to deposit a second epitaxial material on the first epitaxial material, the epitaxial source/drain region comprising the first epitaxial material and the second epitaxial material, wherein after performing the second deposition process, bottom surfaces of the epitaxial source/drain region between adjacent fins extend a second height above the isolation region that is greater than the first height.

2. The method of claim 1, wherein the etching process etches {110} surfaces at a greater rate than {111} surfaces.

3. The method of claim 1, wherein after performing the second deposition process, surfaces of the epitaxial source/drain region extending from the isolation region to a third height are {111} facets, wherein the third height is less than the first height.

4. The method of claim 1, wherein the etching process reduces a lateral width of the first epitaxial material.

5. The method of claim 1, wherein the etching process comprises an anisotropic dry etching process.

6. The method of claim 1, wherein a top surface of the second epitaxial material is level.

7. The method of claim 1, wherein upper surfaces of the first epitaxial material and bottom surfaces of the first epitaxial material are {111} facets.

8. The method of claim 1, wherein laterally outermost surfaces of the first epitaxial material comprise {110} facets.

9. A method comprising:
   forming a first fin and a second fin protruding from a semiconductor substrate;
   performing a first epitaxial growth process to form a first epitaxial region on the first fin and a second epitaxial region on the second fin, wherein the upper surfaces and lower surfaces of the first epitaxial region and the second epitaxial region are {111} facets, wherein middle surfaces of the first epitaxial region and the second epitaxial region that are between the upper surfaces and the lower surfaces comprise {110} facets;
   performing an anisotropic etching process to preferentially etch the {110} facets of the first epitaxial region and the second epitaxial region; and
   performing a second epitaxial growth process to form a third epitaxial region on the first epitaxial region and the second epitaxial region, wherein the third epitaxial region continuously extends from the first epitaxial region to the second epitaxial region.

10. The method of claim 9, wherein, after performing the first epitaxial growth process, the first epitaxial region and the second epitaxial region are merged at a first height above the semiconductor substrate.

11. The method of claim 10, wherein, after performing the anisotropic etching process, the first epitaxial region and the second epitaxial region are unmerged.

12. The method of claim 10, wherein, after performing the second epitaxial growth process, the first epitaxial region and the second epitaxial region are merged at a second height above the semiconductor substrate greater than the first height.

13. The method of claim 9, wherein the middle surfaces comprise {111} facets.

14. The method of claim 9, wherein the middle surfaces have a greater slope than the upper surfaces and the lower surfaces.

15. The method of claim 9, wherein the anisotropic etching process etches the upper surfaces of the first epitaxial region and the second epitaxial region.

16. A method comprising:
   forming a first fin and a second fin on a substrate;
   forming a first epitaxial source/drain region on the first fin;
   forming a second epitaxial source/drain region on the second fin, wherein the first epitaxial source/drain region and the second epitaxial source/drain region merge at a first height above the substrate;
   etching upper surfaces and side surfaces of the first epitaxial source/drain region and the second epitaxial source/drain region using an etching process; and
   depositing an epitaxial material on the first epitaxial source/drain region and the second epitaxial source/drain region to form an epitaxial structure comprising the first epitaxial source/drain region, the second epitaxial source/drain region, and the epitaxial material, wherein a bottom surface of the epitaxial structure has a slope turning point that is a second height above the substrate less than the first height, wherein the bottom surface has a first slope below the slope turning point and a second slope above the slope turning point that is greater than the first slope.

17. The method of claim 16, wherein the second slope is in the range of 54.7° to 90°.

18. The method of claim 16, wherein, after depositing the epitaxial material, the first epitaxial source/drain region and the second epitaxial source/drain region merge at a second height above the substrate that is greater than the first height.

19. The method of claim 18, wherein the laterally outermost surface of the epitaxial structure is a third height above the substrate that is less than the second height.

20. The method of claim 16, wherein the bottom surface below the slope turning point is a {111} facet.

* * * * *